(12) United States Patent
Chiu

(10) Patent No.: US 11,825,649 B2
(45) Date of Patent: Nov. 21, 2023

(54) SEMICONDUCTOR DEVICE WITH PROGRAMMABLE UNIT AND METHOD FOR FABRICATING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 317 days.

(21) Appl. No.: 17/464,619

(22) Filed: Sep. 1, 2021

(65) Prior Publication Data
US 2023/0066641 A1    Mar. 2, 2023

(51) Int. Cl.
H10B 20/20    (2023.01)
(52) U.S. Cl.
CPC .................................... H10B 20/20 (2023.02)
(58) Field of Classification Search
CPC .... H10B 20/20; H01L 23/5252; G11C 17/165
See application file for complete search history.

(56) References Cited

U.S. PATENT DOCUMENTS

| 6,137,713 | A | * | 10/2000 | Kuroda | G11C 11/24 |
| | | | | | 257/E27.084 |
| 7,428,167 | B2 | | 9/2008 | Shukuri et al. | |
| 8,890,233 | B2 | * | 11/2014 | Hung | H01L 29/4234 |
| | | | | | 257/329 |
| 9,299,707 | B2 | * | 3/2016 | Lee | H10B 99/00 |

FOREIGN PATENT DOCUMENTS

| TW | I339891 B | 4/2011 |
| TW | I548033 B | 9/2016 |
| TW | I658569 B | 5/2019 |

OTHER PUBLICATIONS

Office Action with the search report dated Sep. 7, 2022 related to Taiwanese Application No. 110147967.

* cited by examiner

*Primary Examiner* — Allison Bernstein
(74) *Attorney, Agent, or Firm* — Xuan Zhang

(57) ABSTRACT

The present application discloses a semiconductor device and a method for fabricating the semiconductor device. The semiconductor device includes a first dielectric layer on a substrate; first/second upper short axis portions extending along a first direction, separated from each other, and on the first dielectric layer; a common source region in the substrate and adjacent to the first/second upper short axis portions; a first branch drain region in the substrate, adjacent to the first upper short axis portion, and opposite to the common source region; a second branch drain region in the substrate, adjacent to the second upper short axis portion, and opposite to the common source region; and a top electrode on the first dielectric layer and topographically above the first branch drain region and the second branch drain region. The top electrode, the first dielectric layer, and the first/second branch drain regions together configure a programmable unit.

20 Claims, 23 Drawing Sheets

SEMICONDUCTOR DEVICE WITH PROGRAMMABLE UNIT AND METHOD FOR FABRICATING THE SAME

TECHNICAL FIELD

The present disclosure relates to a semiconductor device and a method for fabricating the semiconductor device, and more particularly, to a semiconductor device with a programmable unit and a method for fabricating the semiconductor device with the programmable unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first dielectric layer positioned on a substrate; a first upper short axis portion and a second upper short axis portion extending along a first direction, separated from each other, and positioned on the first dielectric layer; a first common source region positioned in the substrate and adjacent to the first upper short axis portion and the second upper short axis portion; a first branch drain region positioned in the substrate, adjacent to the first upper short axis portion, and opposite to the first common source region; a second branch drain region positioned in the substrate, adjacent to the second upper short axis portion, and opposite to the first common source region; and a top electrode positioned on the first dielectric layer and topographically above the first branch drain region and the second branch drain region. The top electrode, the first dielectric layer, the first branch drain region, and the second branch drain region together configure a first programmable unit.

In some embodiments, the semiconductor device includes a first long axis portion and a second long axis portion. The first long axis portion is positioned on the first dielectric layer, extending along a second direction perpendicular to the first direction, and connecting to one end of the first upper short axis portion, and the one end of the first upper short axis portion is opposite to the second upper short axis portion. The second long axis portion is positioned on the first dielectric layer, extending along the second direction, and connecting to one end of the second upper short axis portion, and the one end of the second upper short axis portion is opposite to the first upper short axis portion.

In some embodiments, the semiconductor device includes a first lower short axis portion, a second lower short axis portion, a second common source region, and a second programmable unit. The first lower short axis portion is positioned on the first dielectric layer, parallel to the first upper short axis portion, and connecting to the first long axis portion. The second lower short axis portion is positioned on the first dielectric layer, parallel to the second upper short axis portion, connecting to the second long axis portion, and opposite to the first lower short axis portion. The second common source region is positioned in the substrate, separated from the first common source region, and adjacent to the first lower short axis portion and the second lower short axis portion. The second programmable unit is positioned separated from the first programmable unit along the second direction and includes: a first branch drain region positioned in the substrate, adjacent to the first lower short axis portion, and opposite to the second common source region; a second branch drain region positioned in the substrate, adjacent to the second lower short axis portion, and opposite to the second common source region; and a top electrode positioned on the first dielectric layer and topographically above the first branch drain region and the second branch drain region.

In some embodiments, the semiconductor device includes a top contact positioned on the top electrode of the first programmable unit.

In some embodiments, a width of the top contact is less than a horizontal distance between the first branch drain region and the second branch drain region of the first programmable unit.

In some embodiments, a length of the top contact is greater than or equal to a width of the top electrode of the first programmable unit.

In some embodiments, the semiconductor device includes a top conductive layer positioned on the top contact and extending along the first direction.

In some embodiments, the semiconductor device includes a plurality of second spacers positioned on sidewalls of the top conductive layer. The plurality of second spacers includes silicon oxide, silicon nitride, silicon oxynitride, or silicon nitride oxide.

In some embodiments, the semiconductor device includes a source contact positioned on the first common source region.

In some embodiments, the semiconductor device includes a bit line positioned on the source contact and extending along the first direction.

In some embodiments, a width of the top electrode is greater than or equal to a width of the source contact.

In some embodiments, the semiconductor device includes a third upper short axis portion, a fourth upper short axis portion, a second common source region, and a second programmable unit. The third upper short axis portion is positioned on the first dielectric layer, opposite to the second upper short axis portion with the second long axis portion interposed therebetween, and extending along the first direction. The fourth upper short axis portion is positioned on the first dielectric layer, separated from the third upper short axis portion, opposite to the second long axis portion, and extending along the first direction. The second common source region is positioned in the substrate and adjacent to the third upper short axis portion and the fourth upper short axis portion. The second programmable unit is positioned separated from the first programmable unit along the first direction and includes: a first branch drain region positioned in the substrate, adjacent to the third upper short axis portion, and opposite to the second common source region; a second branch drain region positioned in the substrate, adjacent to the fourth upper short axis portion, and opposite to the second common source region; and a top electrode positioned on the first dielectric layer and topographically above the first branch drain region and the second branch drain region.

In some embodiments, the semiconductor device includes a first top contact, a second top contact, and a top conductive layer. The first top contact is positioned on the top electrode of the first programmable unit. The second top contact is positioned on the top electrode of the second programmable unit. The top conductive layer is extending along the first direction and positioned on the first top contact and the second top contact.

In some embodiments, the semiconductor device includes a first source contact, a second source contact, and a bit line. The first source contact is positioned on the first common source region. The second source contact is positioned on the second common source region. The bit line is extending along the first direction and positioned on the first source contact and the second source contact.

In some embodiments, a width of the first source contact is greater than a width of first top contact.

In some embodiments, a width of the first source contact is greater than or equal to a distance between the first branch drain region and the second branch drain region of the first programmable unit.

Another aspect of the present disclosure provides a method for fabricating a semiconductor device including forming a common source region, a first branch drain region, and a second branch drain region in a substrate, wherein the first branch drain region and the second branch drain region are parallel to each other and both are separated from the common source region; forming a first dielectric layer on the substrate; forming a first upper short axis portion and a second upper short axis portion on the first dielectric layer, wherein the first upper short axis portion and the second upper short axis portion are extending along a first direction and separated from each other, wherein the first upper short axis portion is between the common source region and the first branch drain region, and the second upper short axis portion is between the common source region and the second branch drain region; and forming a top electrode on the first dielectric layer and topographically above the first branch drain region and the second branch drain region. The first branch drain region, the second branch drain region, the first dielectric layer, and the top electrode together configure a programmable unit.

In some embodiments, the method for fabricating the semiconductor device includes: forming a top contact on the top electrode; forming a source contact along the first dielectric layer and on the common source region; forming a top conductive layer on the top contact and extending along the first direction; and forming a bit line on the source contact and extending along the first direction.

In some embodiments, the top electrode and the first upper short axis portion are concurrently formed.

In some embodiments, the top contact and the source contact are concurrently formed.

Due to the design of the semiconductor device of the present disclosure, the resistance of the programmable unit may be adjusted by controlling the number of activated (i.e., voltage applied) word line structures. In addition, by employing the top conductive layers, which are simultaneously coupled to multiple programmable units, and the bit lines, it is possible to individually control the programming states (blown out or not) and the resistance state for the programmable units.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
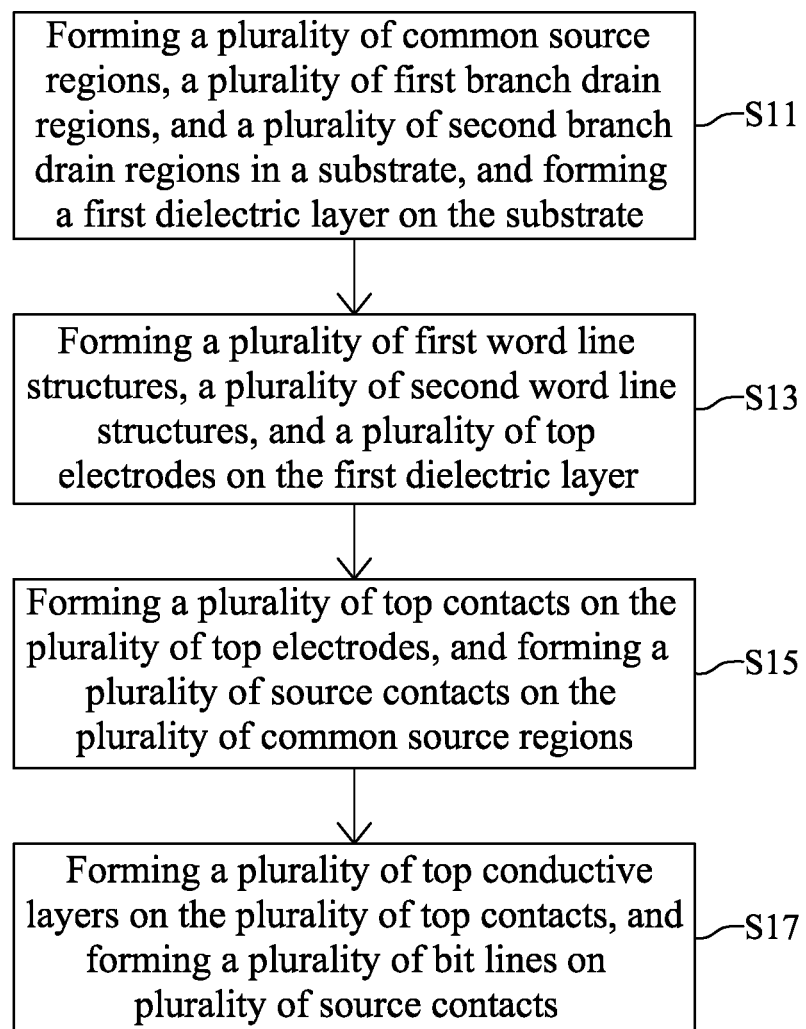
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
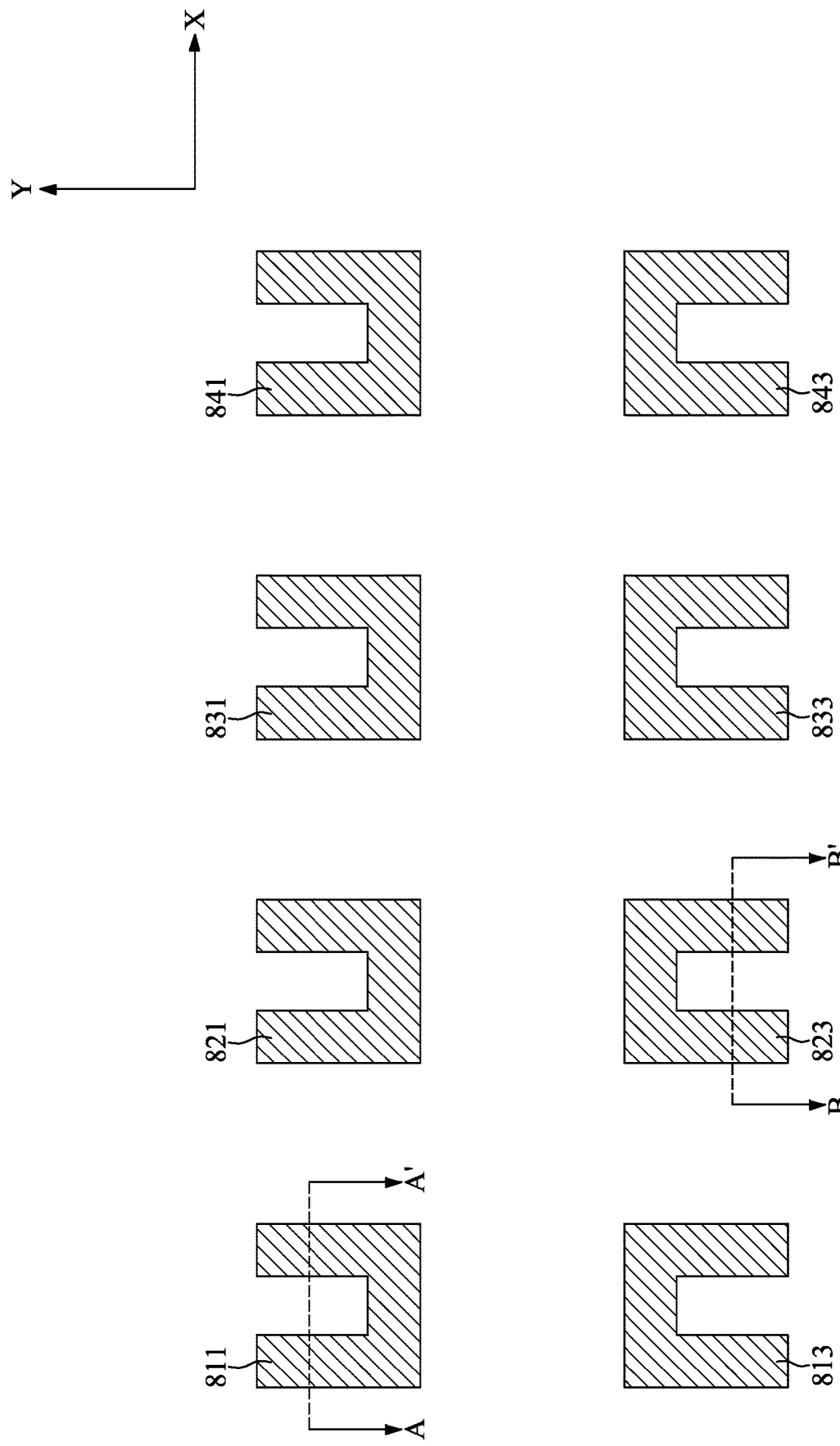
FIG. 2 illustrates, in a schematic top-view diagram, an intermediate semiconductor device in accordance with one embodiment of the present disclosure.
Figure 3:
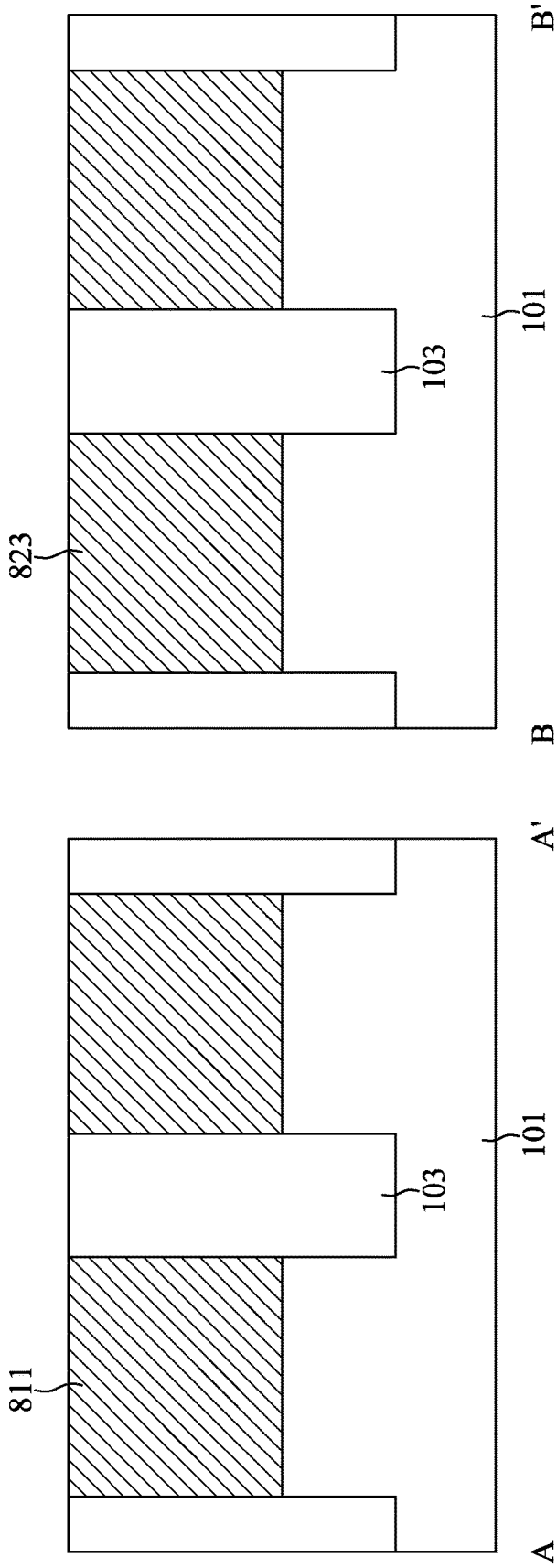
FIG. 3 illustrate, in a schematic cross-sectional view diagram, an intermediate semiconductor device in accordance with one embodiment of the present disclosure.

FIG. 1 illustrates, in a flowchart diagram form, a method 10 for fabricating a semiconductor device in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along the line A-A' and the line B-B' in FIG. 2 illustrating part of a flow for fabricating the semiconductor device in accordance with one embodiment of the present disclosure.

With reference to FIGS. 1 to 8, at step S11, a plurality of common source regions 211, 213, 215, 217, 221, 223, 225, 227, a plurality of first branch drain regions 231, 233, 235, 237, 241, 243, 245, 247, and a plurality of second branch drain regions 251, 253, 255, 257, 261, 263, 265, 267 may be formed in a substrate 101, and a first dielectric layer 271 may be formed on the substrate 101.

With reference to FIGS. 2 and 3, the substrate 101 may be a bulk semiconductor substrate, a multi-layered or gradient substrate, or the like. The substrate 101 may include a semiconductor material, such as an elemental semiconductor including silicon and germanium; a compound or alloy semiconductor including silicon carbide, silicon germanium, gallium arsenide, gallium phosphide, gallium arsenide phosphide, aluminum indium arsenide, aluminum gallium arsenide, gallium indium arsenide, indium arsenide, gallium indium phosphide, indium phosphide, indium antimonide, or gallium indium arsenide phosphide; or a combination thereof. The substrate 101 may be doped or undoped.

With reference to FIGS. 2 and 3, an isolation layer 103 may be formed in the substrate 101. The isolation layer 103 may be, for example, silicon oxide, silicon nitride, silicon oxynitride, silicon nitride oxide, or fluoride-doped silicate. The isolation layer 103 may define the regions of a plurality of pre-active regions 811, 813, 821, 823, 831, 833, 841, 843.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 2 and 3, an implantation process may be performed to form the plurality of pre-active regions 811, 813, 821, 823, 831, 833, 841, 843 in the substrate 101 and surrounded by the isolation layer 103. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorus. After the implantation process, the plurality of pre-active regions 811, 813, 821, 823, 831, 833, 841, 843 may have an electrical type such as n-type or p-type. In the present embodiment, the electrical type of the plurality of pre-active regions 811, 813, 821, 823, 831, 833, 841, 843 may be p-type.

The plurality of pre-active regions 811, 813, 821, 823, 831, 833, 841, 843 may be alternatively arranged along the direction (or dimension) X and the direction (or dimension) Y. That is, along the direction X or the direction Y, adjacent pre-active regions may be distant with a substantially same distance. The upper row of the pre-active regions 811, 821, 831, 841 may have a U-shaped profile in a top-view perspective. The lower row of the pre-active regions 813, 823, 833, 843 may have an inverted U-shaped profile in a top-view perspective.

Figure 4:
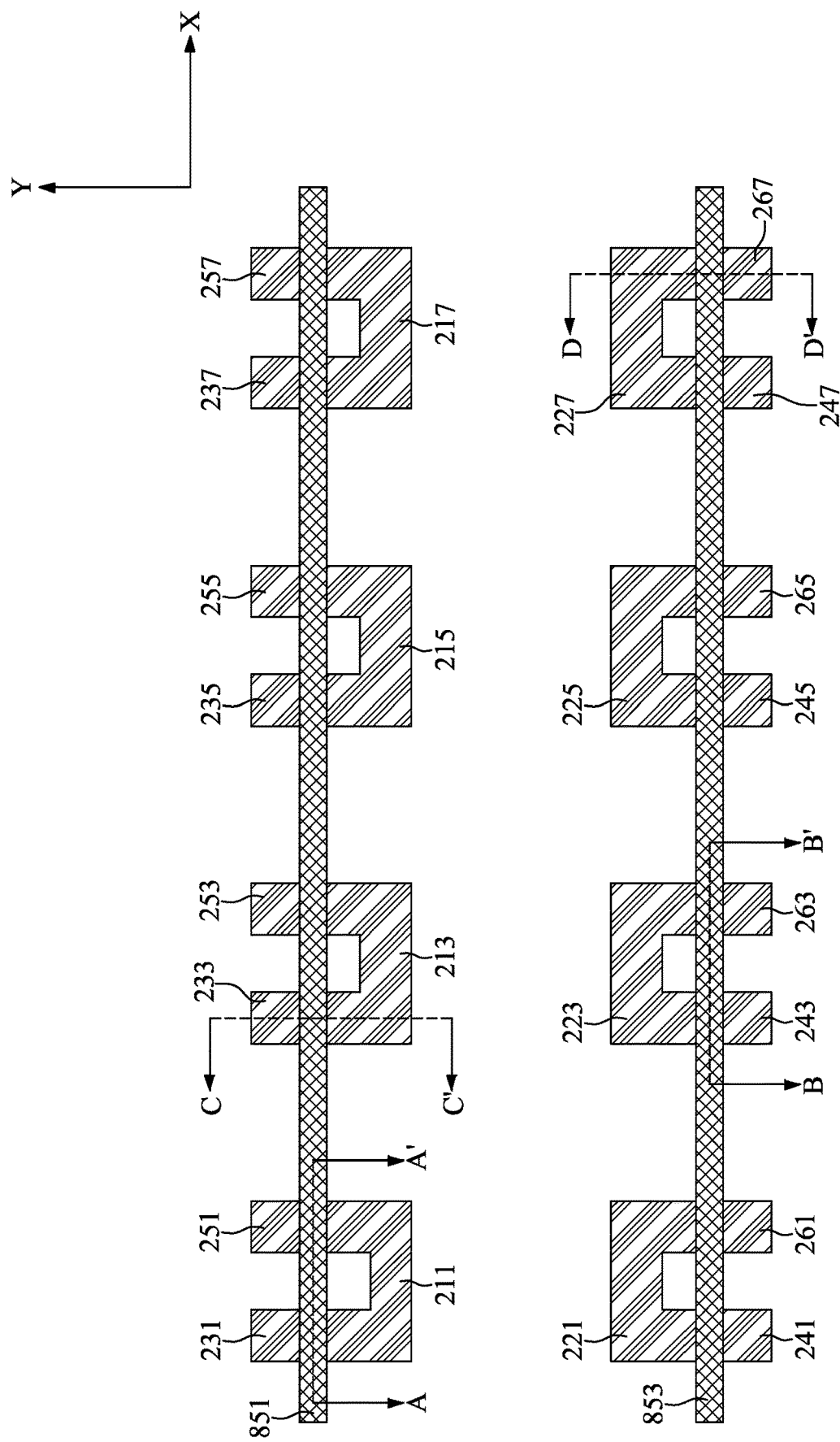
FIG. 4 illustrates, in a schematic top-view diagram, an intermediate semiconductor device in accordance with one embodiment of the present disclosure.
Figure 5:
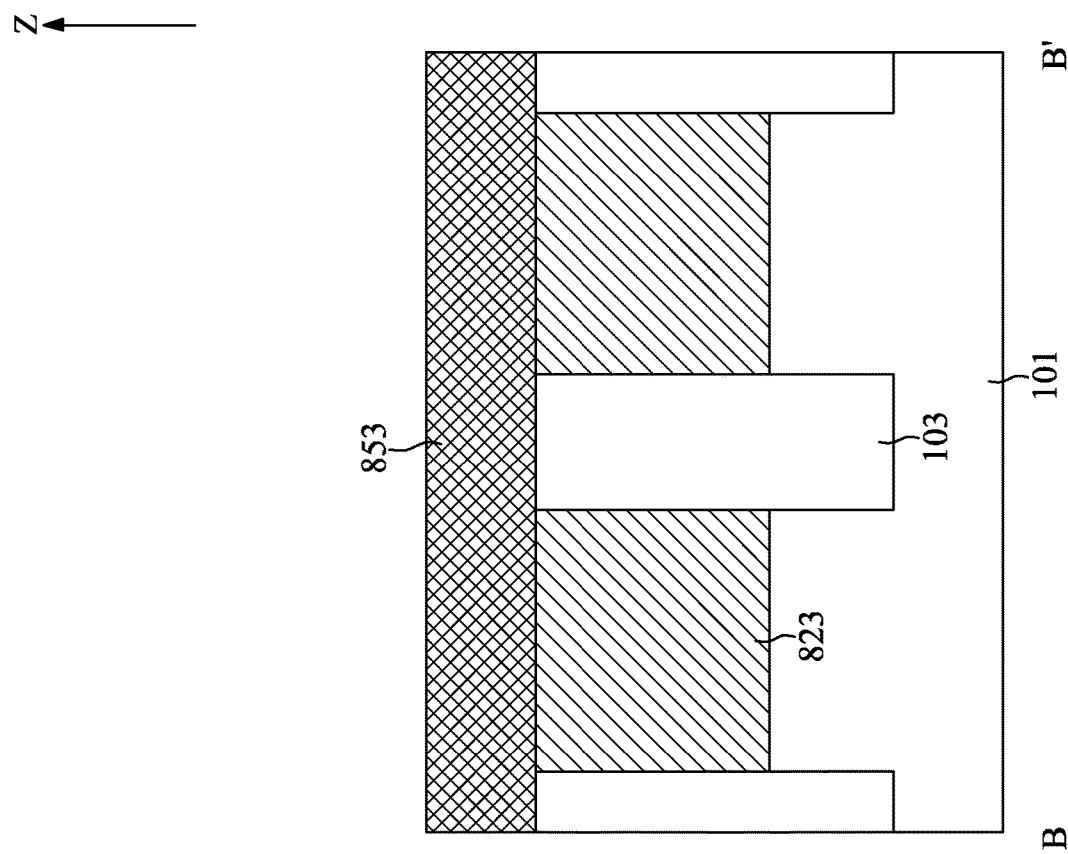
FIGS. 5 to 8 illustrate, in schematic cross-sectional view diagram, intermediate semiconductor devices in accordance with one embodiment of the present disclosure.
Figure 6:
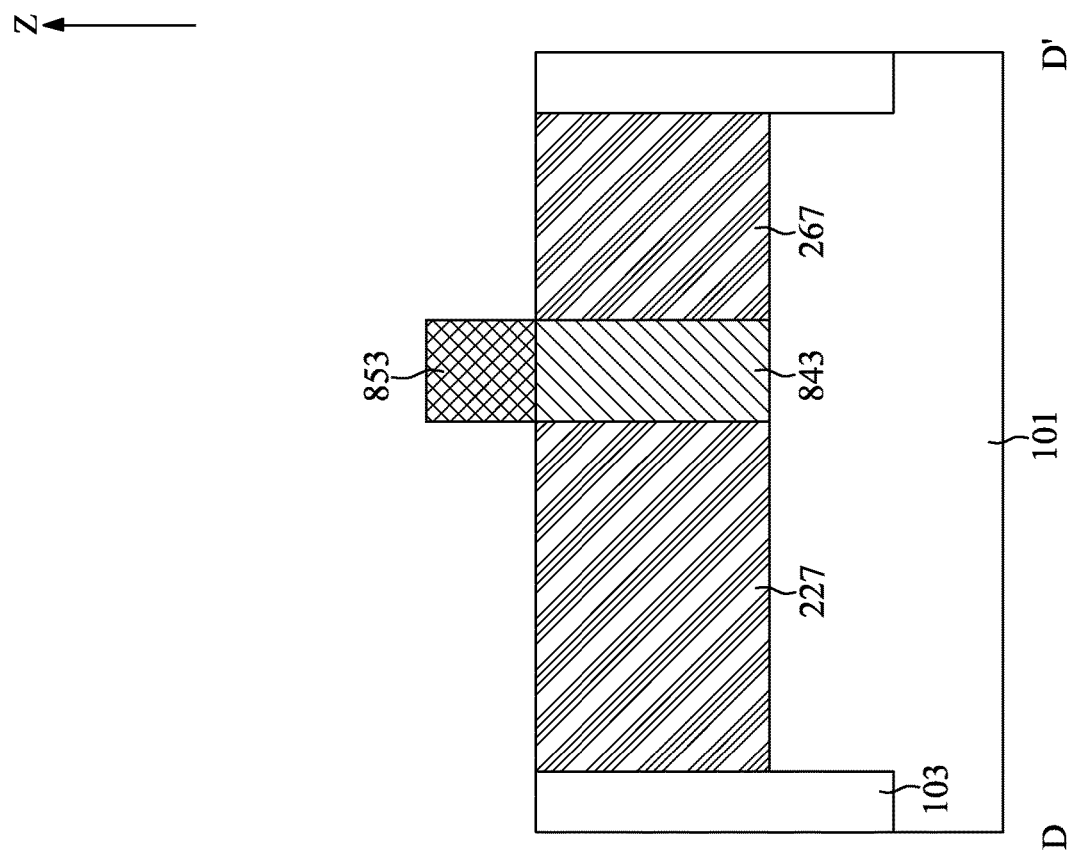
Figure 6:
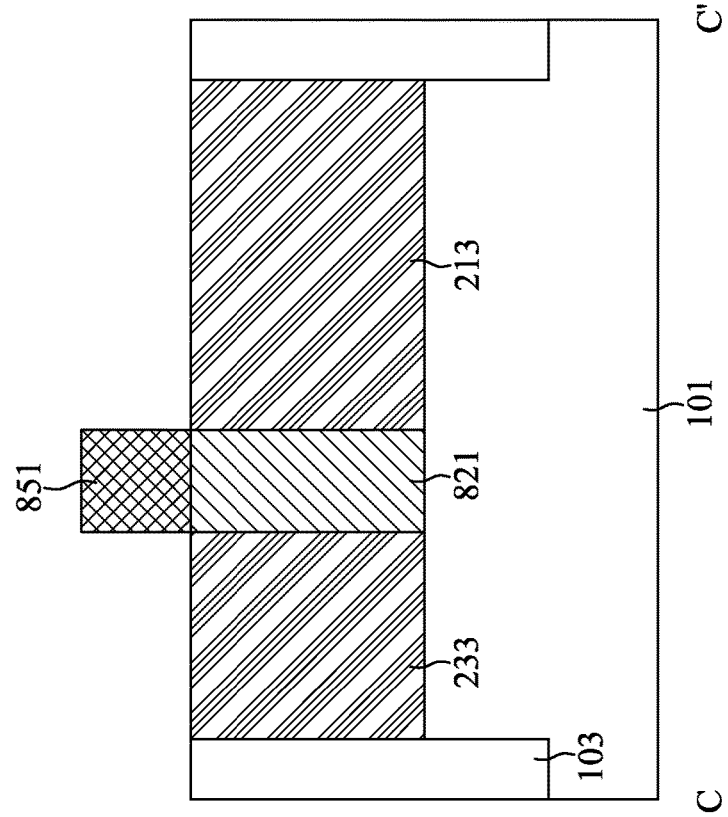

FIG. 4 illustrates, in a schematic top-view diagram, an intermediate semiconductor device in accordance with one embodiment of the present disclosure. FIGS. 5 and 6 are schematic cross-sectional view diagrams taken along the line A-A' and the line B-B' and along the line C-C' and the line D-D' in FIG. 4 illustrating part of the flow for fabricating the semiconductor device in accordance with one embodiment of the present disclosure.

With reference to FIGS. 4 to 6, a plurality of first mask layers 851, 853 may be formed on the substrate 101. The plurality of first mask layers 851, 853 may extend along the direction X and may be separated from each other. In a top-view perspective, the first mask layer 851 may across the upper row of the pre-active regions 811, 821, 831, 841 to divide each of the pre-active regions 811, 821, 831, 841 into upper parts and lower parts while covers portions of the pre-active regions 811, 821, 831, 841 underneath the first mask layer 851. Accordingly, the first mask layer 853 may across the lower row of the pre-active regions 811, 821, 831, 841 to divide each of the pre-active regions 813, 823, 833, 843 into upper parts and lower parts while covers portions of the pre-active regions 813, 823, 833, 843 underneath the first mask layer 853.

With reference to FIGS. 4 to 6, an implantation process including n-type dopants, which are opposite to the electrical type of the pre-active regions 811, 813, 821, 823, 831, 833, 841, 843, may be performed to dope the unmasked parts of the plurality of pre-active regions 811, 813, 821, 823, 831, 833, 841, 843. After the implantation process, the upper parts of the pre-active regions 811, 821, 831, 841 may be turned into a plurality of first branch drain regions 231, 233, 235, 237 and a plurality of second branch drain regions 251, 253, 255, 257, respectively and correspondingly. The lower parts of the pre-active regions 811, 821, 831, 841 may be turned into a plurality of common source regions 211, 213, 215, 217, respectively and correspondingly. The upper parts of the pre-active regions 813, 823, 833, 843 may be turned into a plurality of common source regions 221, 223, 225, 227, respectively and correspondingly. The lower parts of the pre-active regions 813, 823, 833, 843 may be turned into a plurality of first branch drain regions 241, 243, 245, 247 and a plurality of second branch drain regions 261, 263, 265, 267, respectively and correspondingly. The plurality of first mask layers 851, 853 may be removed after the implantation process.

For brevity, clarity, and convenience of description, only some of the common source regions, some of the first branch drain regions, and some of the second branch drain regions are described.

In a top-view perspective, the common source region 213 may have a U-shaped profile. The two branch portions of the U-shaped profile may simultaneously contact the lower side of the first mask layer 851. In a cross-sectional perspective, the two branch portions of the U-shaped profile may contact one side of the remaining pre-active region 821 under the first mask layer 851.

In some embodiments, in a top-view perspective, the common source region 213 may have a line-shaped profile (or a bar-shaped profile) extending along the direction X. One side of the line-shaped profile may contact the lower side of the first mask layer 851.

In a top-view perspective, the common source region 227 may have an inverted U-shaped profile. The two branch portions of the inverted U-shaped profile may simultaneously contact the upper side of the first mask layer 853. In a cross-sectional perspective, the two branch portions of the inverted U-shaped profile may contact one side of the remaining pre-active region 843 under the first mask layer 853.

In some embodiments, in a top-view perspective, the common source region 227 may have a line-shaped profile extending along the direction X. One side of the line shape profile may contact the upper side of the first mask layer 853.

In a top-view perspective, the first branch drain region 233 and the second branch drain region 253 may have line-shaped profiles, respectively. The first branch drain region 233 and the second branch drain region 253 may both extend along the direction Y and may parallel to each other. The lower ends of the first branch drain region 233 and the second branch drain region 253 may simultaneously contact the upper side of the first mask layer 851. That is, the first branch drain region 233 and the second branch drain region 253 may be respectively and correspondingly opposite to the common source region 213 with the first mask layer 851 (in a top-view perspective) or the remaining pre-active region 821 (in a cross-sectional perspective) interposed therebetween.

In a top-view perspective, the first branch drain region 247 and the second branch drain region 267 may have line-shaped profiles, respectively. The first branch drain region 247 and the second branch drain region 267 may both extend along the direction Y and may parallel to each other. The upper ends of the first branch drain region 247 and the second branch drain region 267 may simultaneously contact the lower side of the first mask layer 853. That is, the first branch drain region 247 and the second branch drain region 267 may be respectively and correspondingly opposite to the common source region 227 with the first mask layer 853 (in a top-view perspective) or the remaining pre-active region 843 (in a cross-sectional perspective) interposed therebetween.

Other common source regions, other first branch drain regions, and other second branch drain regions may have similar or the same structures as those described, and descriptions thereof are not repeated herein.

Figure 7:
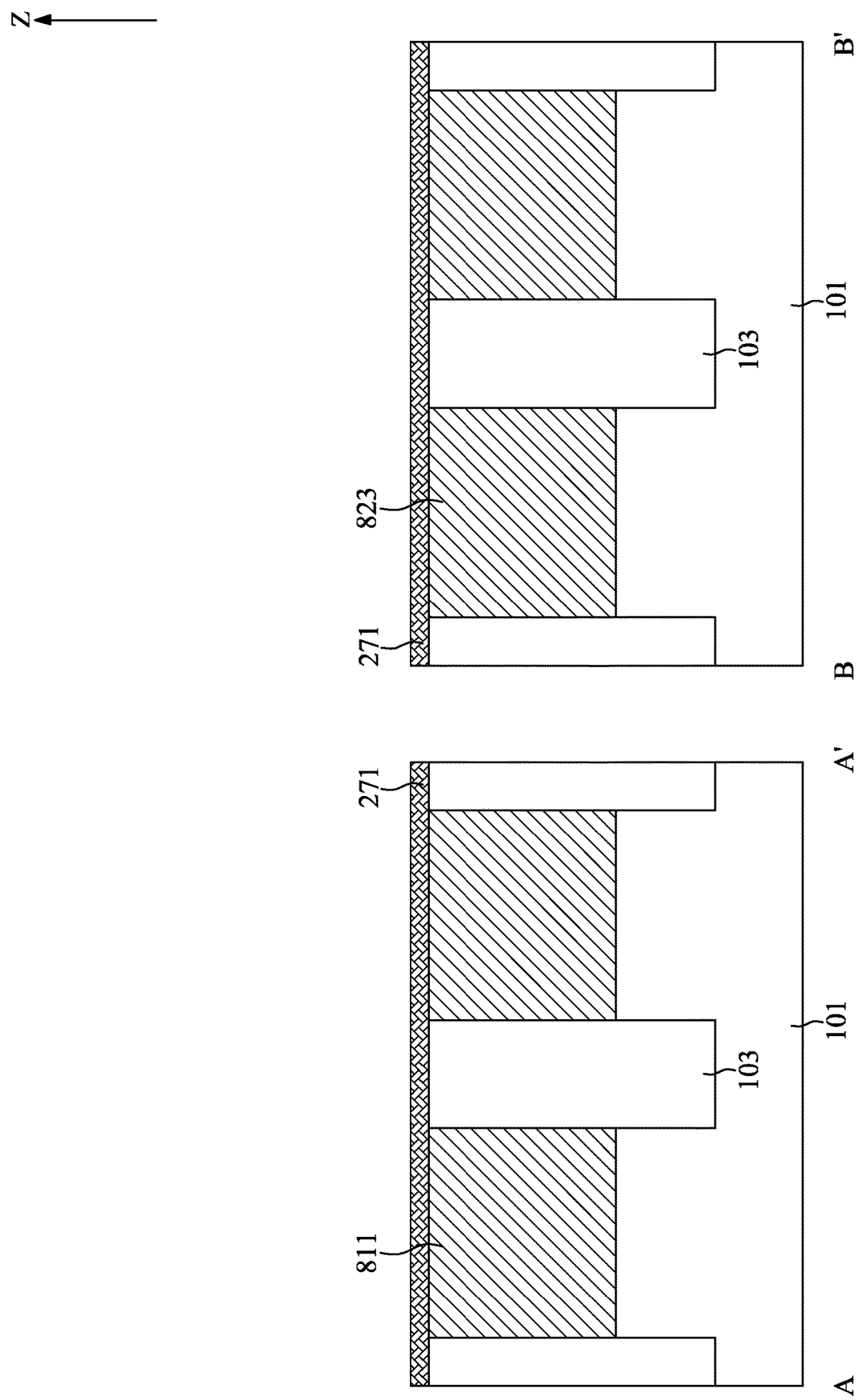
Figure 8:
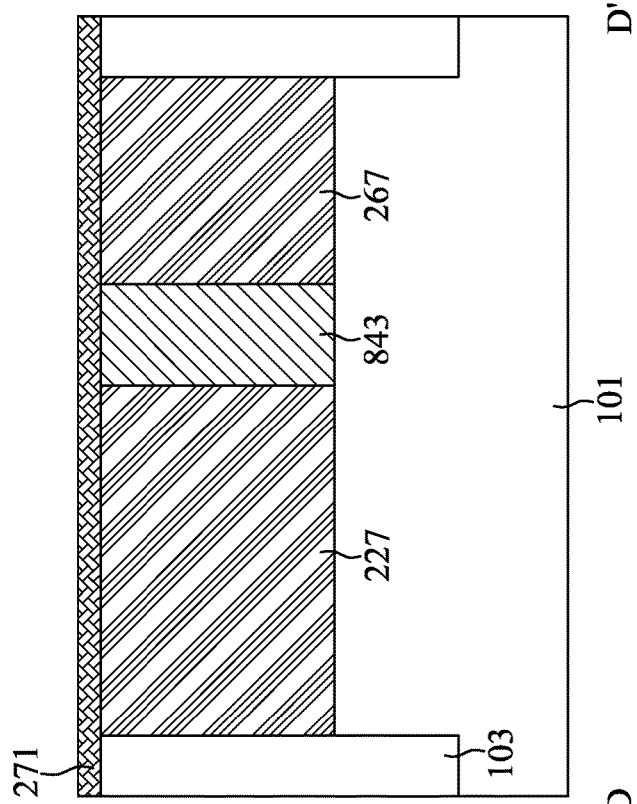
Figure 8:
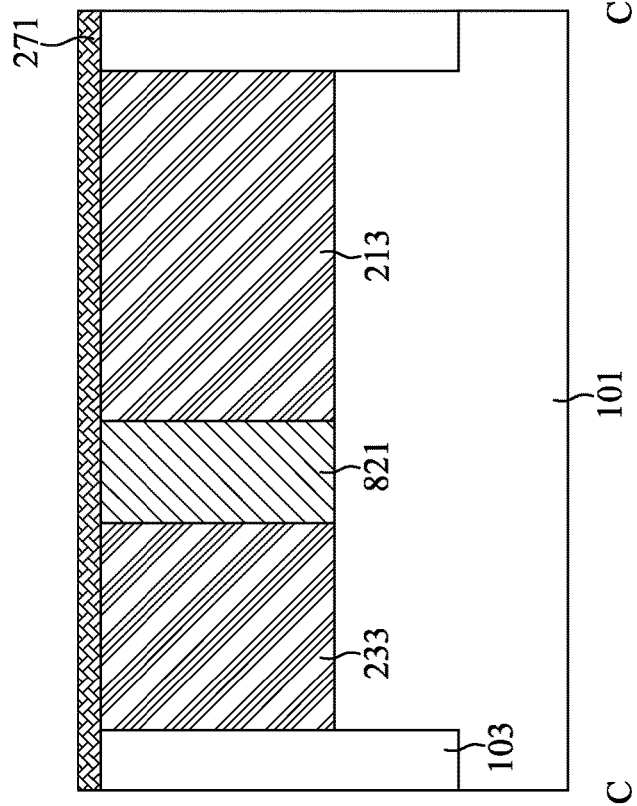

FIGS. 7 and 8 are schematic cross-sectional view diagrams taken along the line A-A' and the line B-B' and along the line C-C' and the line D-D' in FIG. 4 illustrating part of the flow for fabricating the semiconductor device in accordance with one embodiment of the present disclosure.

With reference to FIGS. 7 and 8, the first dielectric layer 271 may be formed on the substrate 101. The first dielectric layer 271 may be formed of, for example, oxides, nitrides, oxynitrides, silicates (e.g., metal silicates), aluminates, titanates, nitrides, high-k dielectric materials, or a combination thereof. The first dielectric layer 271 may be formed by suitable deposition processes, for example, chemical vapor deposition, plasma-enhanced chemical vapor deposition, atomic layer deposition, evaporation, chemical solution deposition, or other suitable deposition processes. The thickness of the first dielectric layer 271 may vary depending on the deposition process as well as the composition and number of materials used. For example, the thickness of the first dielectric layer 271 may be between about 10 angstroms and about 50 angstroms. In some embodiments, the first dielectric layer 271 may include multiple layers. For example, the first dielectric layer 271 may be an oxide-nitride-oxide (ONO) structure. For another example, the first dielectric layer 271 may include a bottom layer formed of silicon oxide and a top layer formed of high-k dielectric materials.

Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants such as, for example, lanthanum and aluminum.

Figure 9:
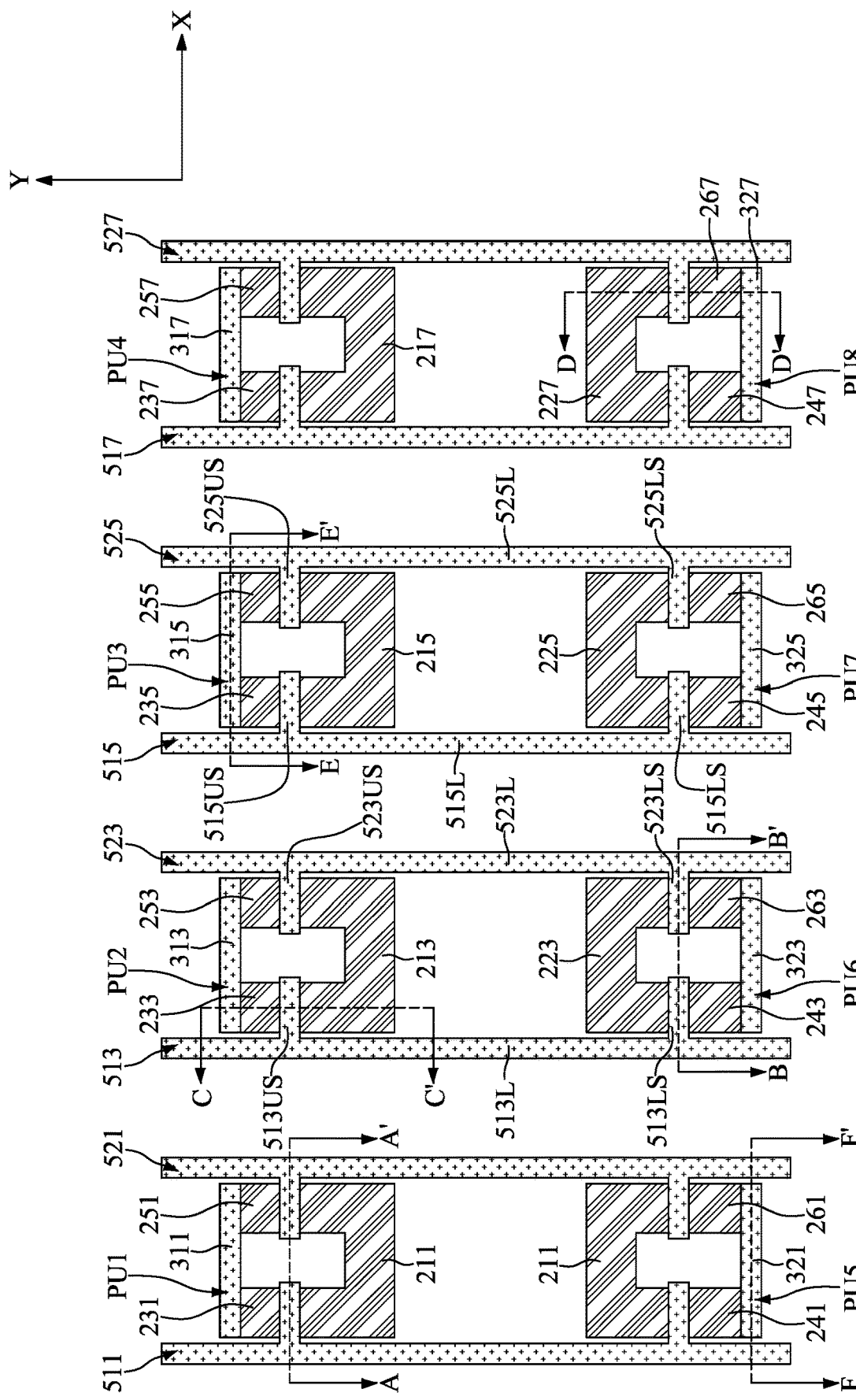
FIG. 9 illustrates, in a schematic top-view diagram, an intermediate semiconductor device in accordance with one embodiment of the present disclosure.
Figure 10:
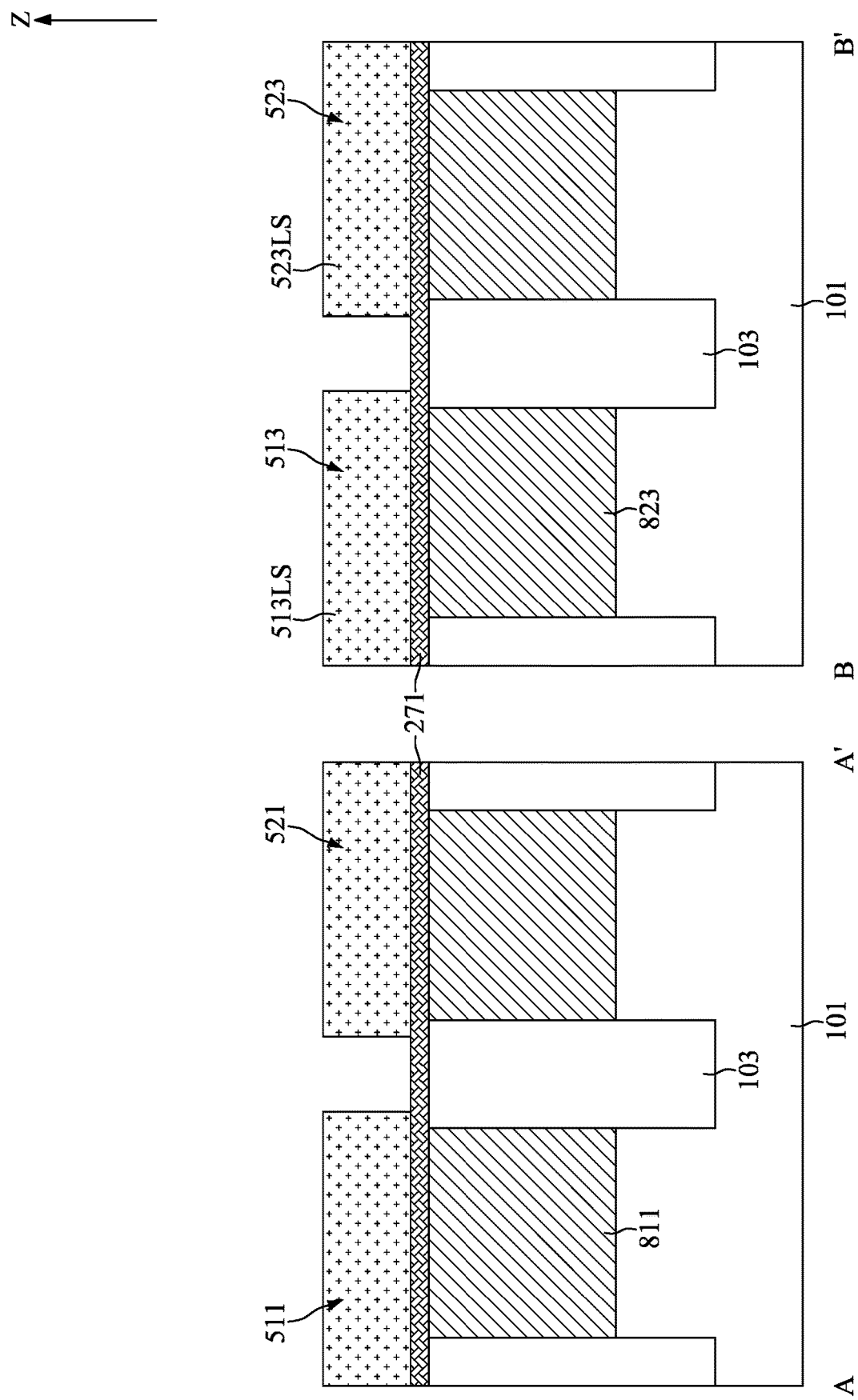
FIGS. 10 to 15 illustrate, in schematic cross-sectional view diagram, intermediate semiconductor devices in accordance with one embodiment of the present disclosure.
Figure 11:
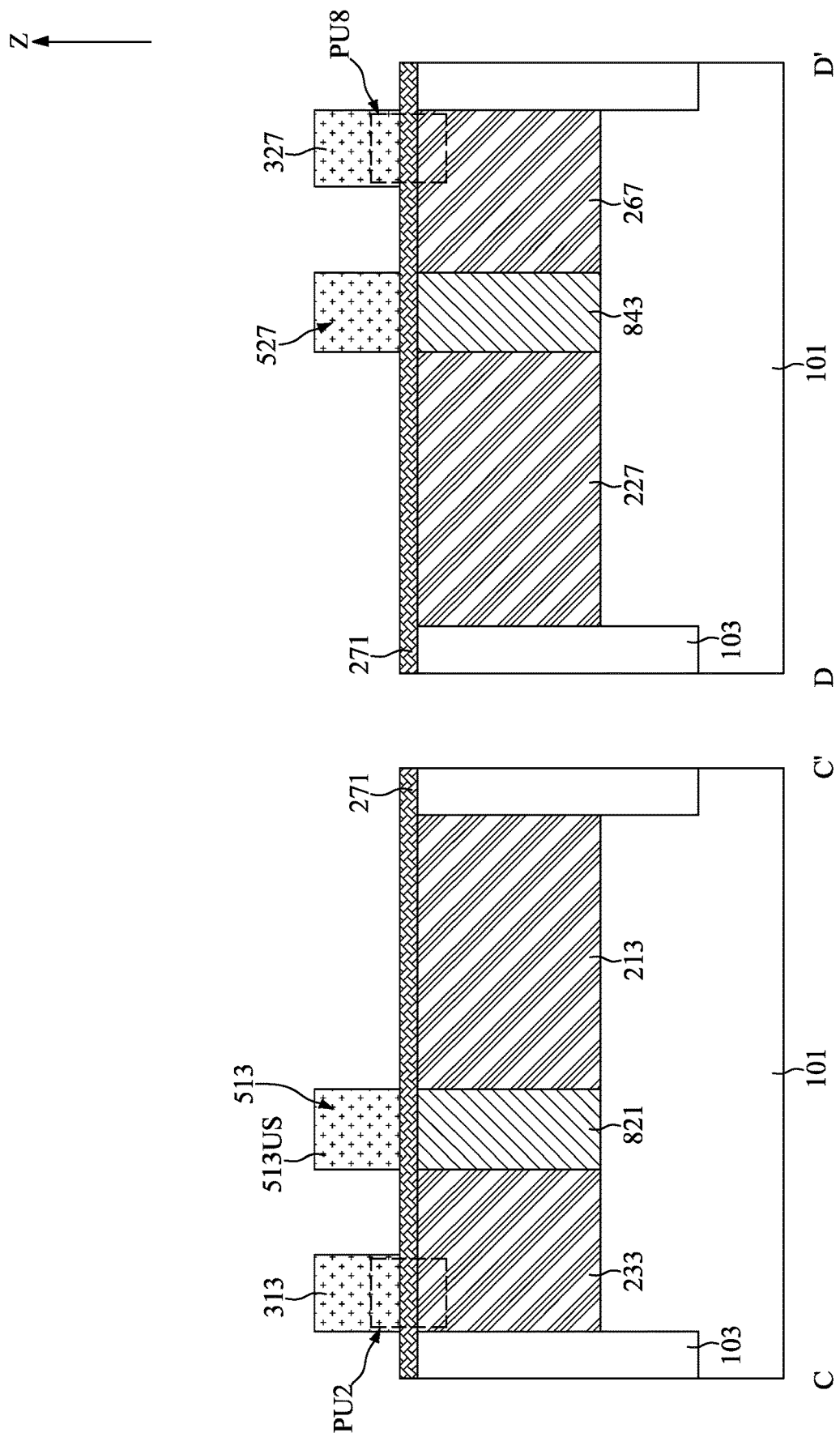
Figure 12:
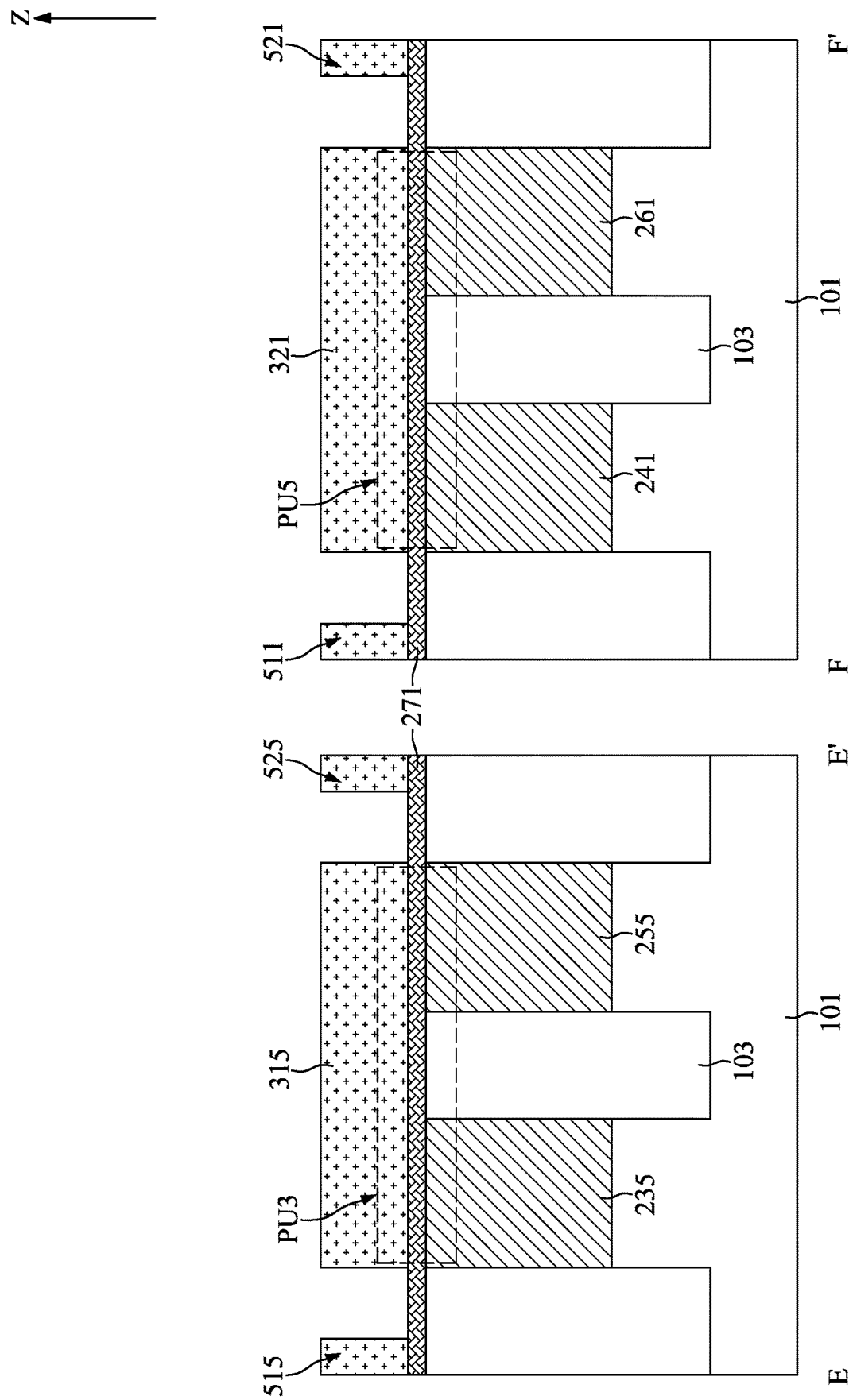

FIG. 9 illustrates, in a schematic top-view diagram, an intermediate semiconductor device in accordance with one embodiment of the present disclosure. FIGS. 10 to 12 are schematic cross-sectional view diagrams taken along the line A-A' and the line B-B', along the line C-C' and the line D-D', and along the line E-E' and the line F-F' in FIG. 9 illustrating part of the flow for fabricating the semiconductor device in accordance with one embodiment of the present disclosure.

With reference to FIG. 1 and FIGS. 9 to 15, at step S13, a plurality of first word line structures 511, 513, 515, 517, a plurality of second word line structures 521, 523, 525, 527, and a plurality of top electrodes 311, 313, 315, 317, 321, 323, 325, 327 may be formed on the first dielectric layer 271.

With reference to FIGS. 9 to 12, the plurality of first word line structures 511, 513, 515, 517 may be alternatively arranged along the direction X. That is, along the direction X, adjacent first word line structures may be distant with a substantially same distance. In a top-view perspective, portions of the plurality of first word line structures 511, 513, 515, 517 may be overlapped with the remaining pre-active regions 811, 813, 821, 823, 831, 833, 841, 843, respectively and correspondingly.

With reference to FIGS. 9 to 12, the plurality of second word line structures 521, 523, 525, 527 may be alternatively arranged along the direction X. That is, along the direction X, adjacent second word line structures may be distant with a substantially same distance. In a top-view perspective, portions of the plurality of second word line structures 521, 523, 525, 527 may be overlapped with the remaining pre-active regions 811, 813, 821, 823, 831, 833, 841, 843, respectively and correspondingly.

In a top-view perspective, the plurality of first word line structures 511, 513, 515, 517 and the plurality of second word line structures 521, 523, 525, 527 may be alternatively arranged along the direction X.

For brevity, clarity, and convenience of description, only some of the first word line structures and some of the second word line structures are described.

In a top-view perspective, the first word line structure 513 may include a first upper short axis portion 513US, a first lower short axis portion 513LS, and a first long axis portion 513L. The first upper short axis portion 513US may have a line-shaped profile. The first upper short axis portion 513US may extend along the direction X and between the first branch drain region 233 and the common source region 213. The first upper short axis portion 513US may be formed on the remaining pre-active region 821 in a cross-sectional perspective.

In a top-view perspective, the first lower short axis portion 513LS may have a line-shaped profile. The first lower short axis portion 513LS may be parallel to the first upper short axis portion 513US. The first lower short axis portion 513LS may be between the common source region 223 and the first branch drain region 243. The first lower short axis portion 513LS may be on the remaining pre-active region 823 (not shown) in a cross-sectional perspective.

In a top-view perspective, the first long axis portion 513L may extend along the direction Y and connect to the left ends of the first upper short axis portion 513US and the first lower short axis portion 513LS. In a cross-sectional perspective, the first long axis portion 513L may not be topographically above the common source region 213, the first branch drain region 233, the common source region 223, and the first branch drain region 243. That is, the first long axis portion 513L may not overlapped with the common source region 213, the first branch drain region 233, the common source region 223, and the first branch drain region 243 in a top-view perspective.

In a top-view perspective, the second word line structure 523 may include a second upper short axis portion 523US, a second lower short axis portion 523LS, and a second long axis portion 523L. The second upper short axis portion 523US may have a line-shaped profile. The second upper short axis portion 523US may extend along the direction X. The second upper short axis portion 523US may be between the second branch drain region 253 and the common source region 213. The second upper short axis portion 523US and the first upper short axis portion 513US may be opposite to each other along the direction X. The second upper short axis portion 523US may be on the remaining pre-active region 821 in a cross-sectional perspective.

In a top-view perspective, the second lower short axis portion 523LS may have a line-shaped profile. The second lower short axis portion 523LS may be parallel to the second upper short axis portion 523US. The second lower short axis portion 523LS may be between the common source region 223 and the second branch drain region 263. The second lower short axis portion 523LS and the first lower short axis portion 513LS may be opposite to each other along the direction X. The second lower short axis portion 523LS may be on the remaining pre-active region 823 in a cross-sectional perspective.

In a top-view perspective, the second long axis portion 523L may extend along the direction Y and connect to the right ends of the second upper short axis portion 523US and the second lower short axis portion 523LS. In a cross-sectional perspective, the second long axis portion 523L may not be topographically above the common source region 213, the second branch drain region 253, the common source region 223, and the second branch drain region 263. That is, the second long axis portion 523L may not overlapped with the common source region 213, the second branch drain region 253, the common source region 223, and the second branch drain region 263 in a top-view perspective.

In a top-view perspective, the first word line structure 515 may be next to the second word line structure 523 and may include a first upper short axis portion 515US, a first lower short axis portion 515LS, and a first long axis portion 515L. The first upper short axis portion 515US may extend along the direction X, be opposite to the second upper short axis portion 523US with the second long axis portion 523L interposed therebetween, and between the first branch drain region 235 and the common source region 215. The first lower short axis portion 515LS may be parallel to the first upper short axis portion 515US, opposite to the second long axis portion 523L with the second long axis portion 523L interposed therebetween, and between the common source region 225 and the first branch drain region 245. The first long axis portion 515L may extend along the second direction and connect to the left ends of the first upper short axis portion 515US and first lower short axis portion 515LS. The first long axis portion 515L may be opposite to the second long axis portion 523L.

In a top-view perspective, the second word line structure 525 may be next to the first word line structure 515 and may include a second upper short axis portion 525US, a second lower short axis portion 525LS, and a second long axis portion 525L. The second upper short axis portion 525US may extend along the direction X, be opposite to the first upper short axis portion 515US, and between the first branch drain region 255 and the common source region 215. The second lower short axis portion 525LS may be parallel to the second upper short axis portion 525US, opposite to the first lower short axis portion 515LS, and between the common source region 225 and the first branch drain region 265. The second long axis portion 525L may extend along the second direction and connect to the right ends of the second upper short axis portion 525US and second lower short axis portion 525LS.

With reference to FIGS. 9 to 12, the plurality of top electrodes 311, 313, 315, 317 may alternatively arranged along the direction X. The plurality of top electrodes 321, 323, 325, 327 may be alternatively arranged along the direction X and respectively and correspondingly parallel to the plurality of top electrodes 311, 313, 315, 317.

For brevity, clarity, and convenience of description, only some of the top electrodes are described.

The top electrode 313 may be formed between the first long axis portion 513L and the second long axis portion 523L in a top-view perspective. The top electrode 313 may be topographically above the first branch drain region 233 and the second branch drain region 253 in a cross-sectional perspective. The top electrode 313 may be overlapped with the first branch drain region 233 and the second branch drain region 253 in a top-view perspective. The top electrode 313, the first branch drain region 233, the second branch drain region 253, and the first dielectric layer 271 sandwiched between the top electrode 313 and the first branch drain region 233 and sandwiched between the top electrode 313 and the second branch drain region 253 may together configure a programmable unit PU2 (also referred to as the first programmable unit) such as an anti-fuse. The first branch drain region 233 or the second branch drain region 253 may individually or simultaneously served as the bottom electrode of the first programmable unit PU2.

In a top-view perspective, the top electrode 323 may be formed between the first long axis portion 513L and the second long axis portion 523L in a top-view perspective. The top electrode 323 may be topographically above the first branch drain region 243 and the second branch drain region 263 in a cross-sectional perspective (not shown). The top electrode 323 may be overlapped with the first branch drain region 243 and the second branch drain region 263 in a top-view perspective. The top electrode 323, the first branch drain region 243, the second branch drain region 263, and the first dielectric layer 271 sandwiched between the top electrode 323 and the first branch drain region 243 and sandwiched between the top electrode 323 and the second branch drain region 263 may together configure another programmable unit PU6 distant from the first programmable unit PU2 along the direction Y.

In a top-view perspective, the top electrode 315 may be formed between the first long axis portion 515L and the second long axis portion 525L in a top-view perspective. The top electrode 315 may be topographically above the first branch drain region 235 and the second branch drain region 255 in a cross-sectional perspective. The top electrode 315 may be overlapped with the first branch drain region 235 and the second branch drain region 255 in a top-view perspective. The top electrode 315, the first branch drain region 235, the second branch drain region 255, and the first dielectric layer 271 sandwiched between the top electrode 315 and the first branch drain region 235 and sandwiched between the top electrode 315 and the second branch drain region 255 may together configure another programmable unit PU3 distant from the first programmable unit PU2 along the direction X.

Other first word line structures, other second word line structures, and other top electrodes may have similar or the same structures as those described, and descriptions thereof are not repeated herein. Other programmable units PU1, PU4, PU5, PU7, PU8 have the same configuration as the programmable units PU2, PU3, PU6, and descriptions thereof are not repeated herein.

In some embodiments, the plurality of first word line structures 511, 513, 515, 517, the plurality of second word line structures 521, 523, 525, 527, and the plurality of top electrodes 311, 313, 315, 317, 321, 323, 325, 327 may be formed of, for example, polycrystalline silicon, doped polycrystalline silicon, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the top electrodes, the first word line structures, and the second word line structures may be concurrently formed. In some embodiments, the top electrodes, the first word line structures, and the second word line structures may be separately formed.

Figure 13:
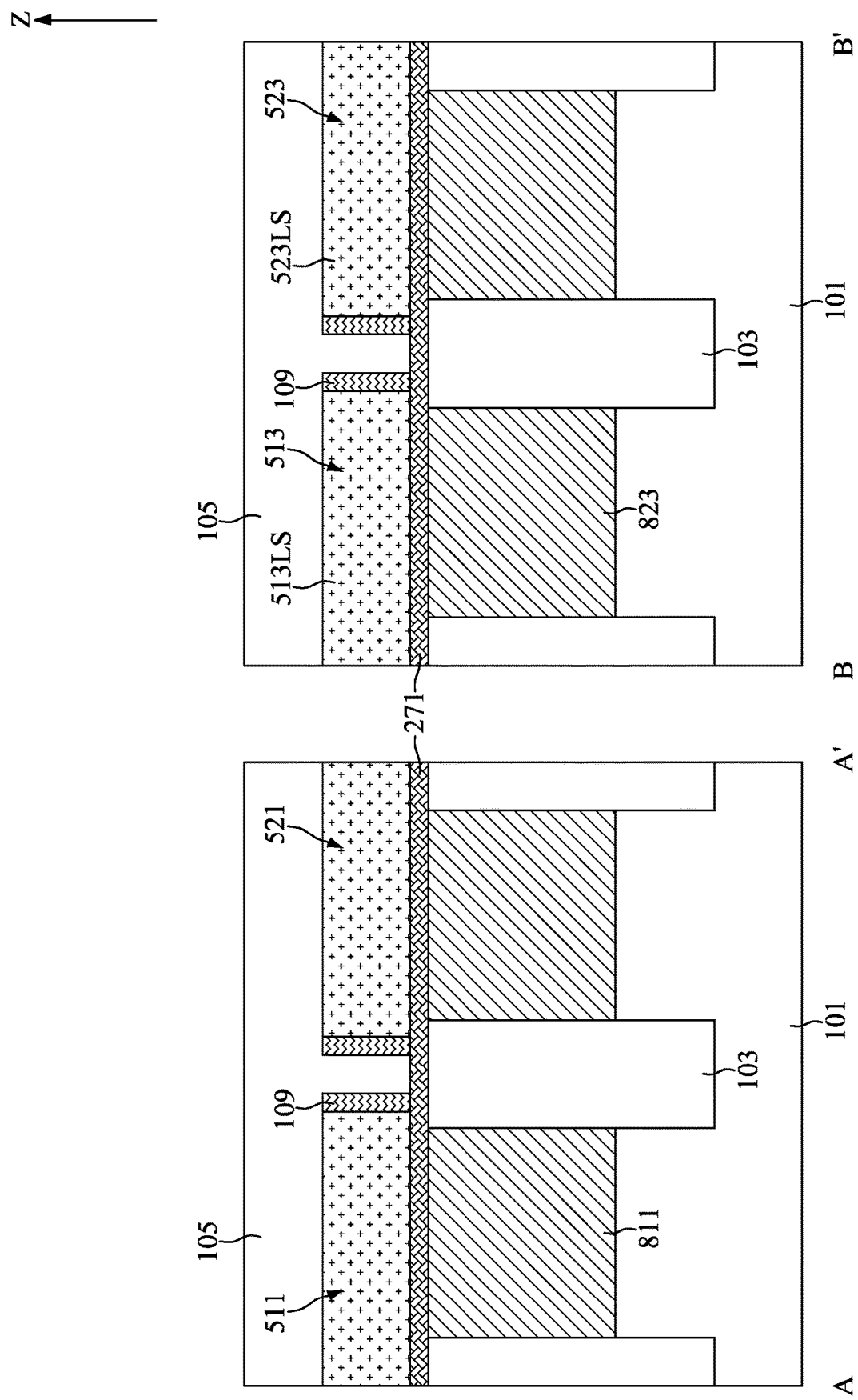
Figure 14:
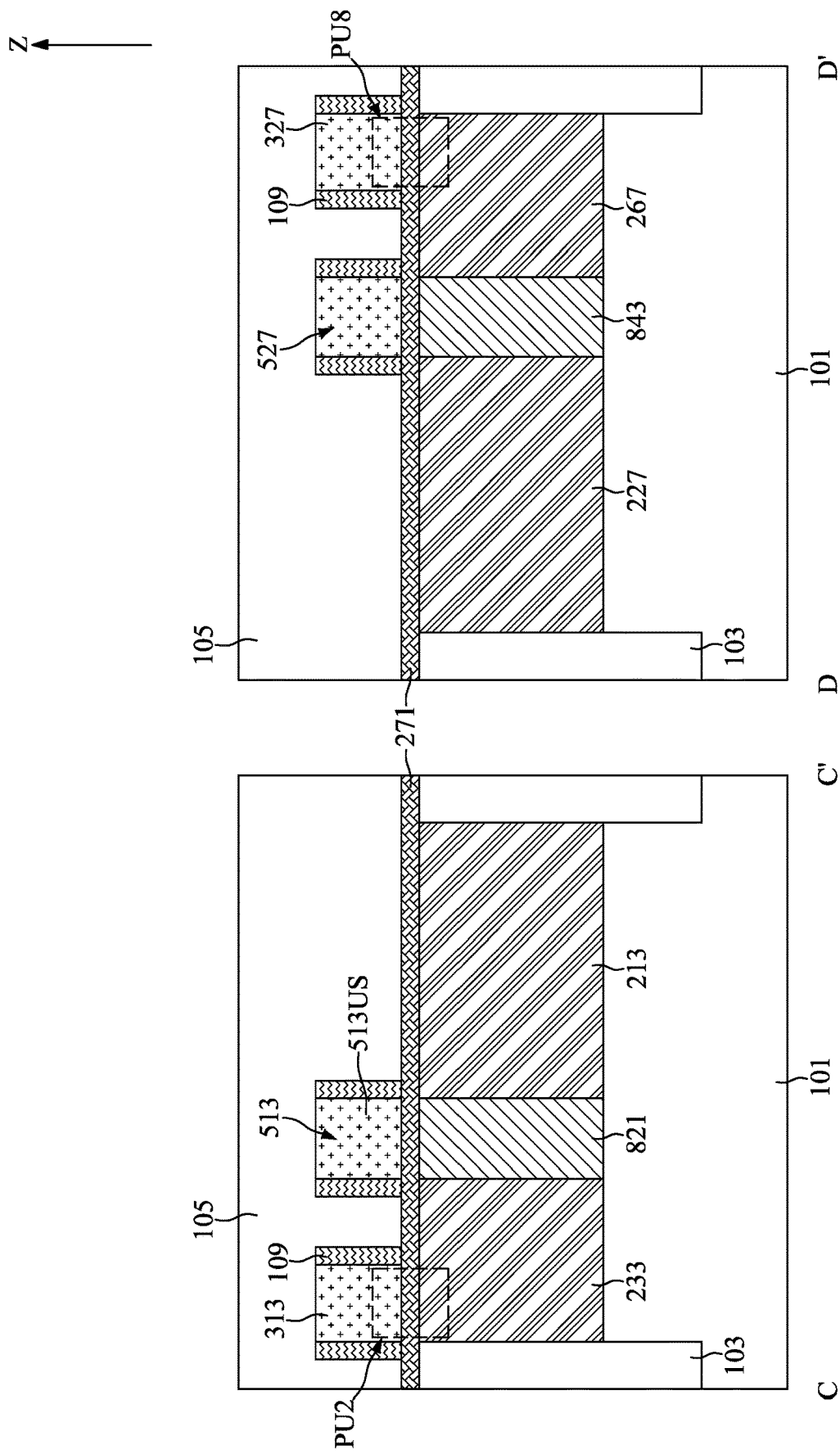
Figure 15:
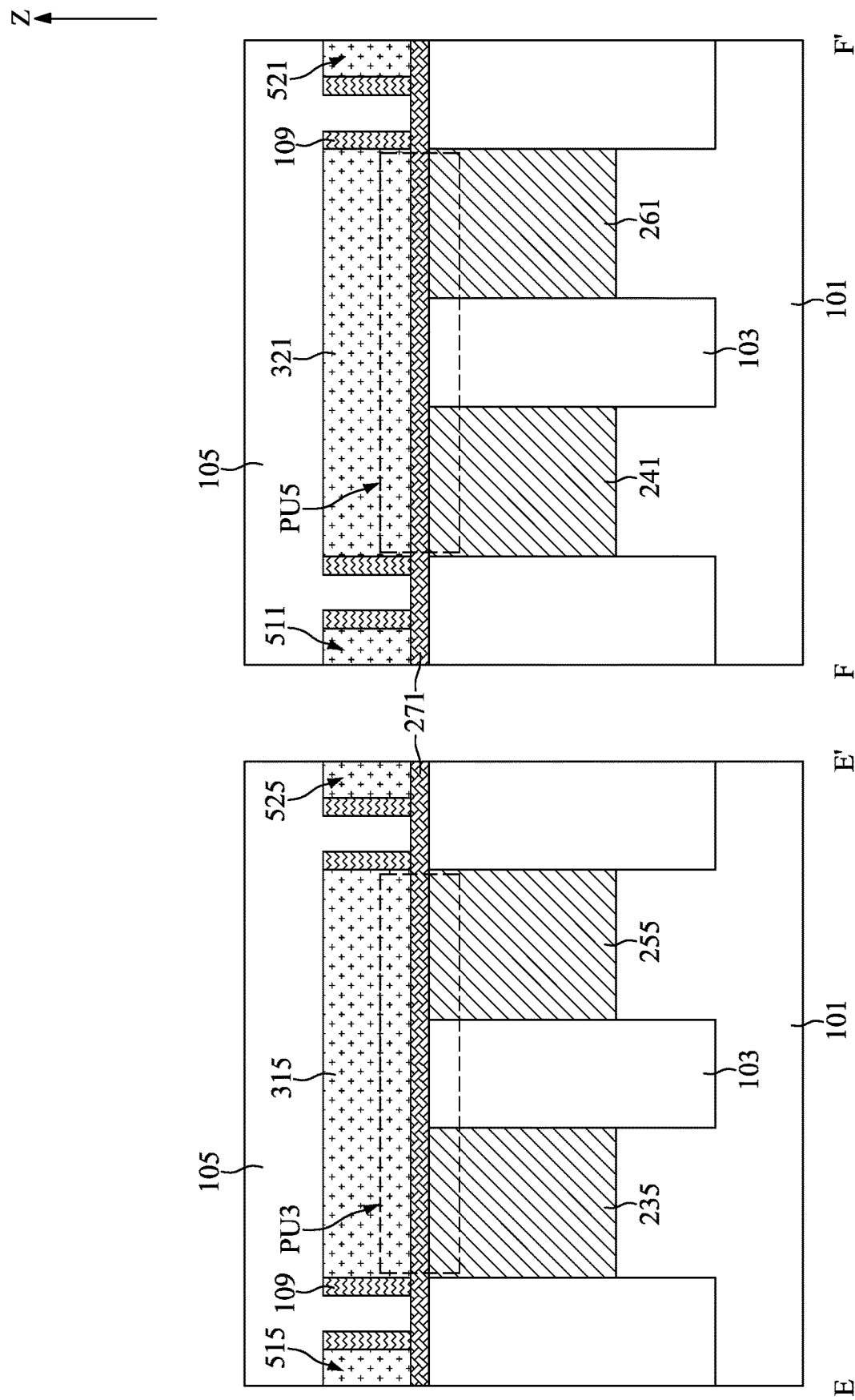

FIGS. 13 to 15 are schematic cross-sectional view diagrams taken along the line A-A' and the line B-B', along the line C-C' and the line D-D', and along the line E-E' and the line F-F' in FIG. 9 illustrating part of the flow for fabricating the semiconductor device in accordance with one embodiment of the present disclosure.

With reference to FIGS. 13 to 15, a plurality of first spacers 109 may be formed on the sidewalls of the plurality of first word line structures 511, 513, 515, 517 and the sidewalls of the plurality of second word line structures 521, 523, 525, 527. The plurality of first spacers 109 may be formed of, for example, silicon oxide, silicon nitride, silicon oxynitride, silicon nitride oxide, the like, or other applicable insulation material. The plurality of first spacers 109 may provide additional electrical insulation between adjacent word line structures. In some embodiments, the plurality of first spacers 109 may be formed of, for example, low-k dielectric material so as to reduce parasitic capacitance between adjacent word line structures.

With reference to FIGS. 13 to 15, a first inter-dielectric layer 105 may be formed over the substrate 101 to cover the word line structures. A planarization process, such as chemical mechanical polishing, may be performed to remove excess material and provide a substantially flat surface for subsequent processing steps. The first inter-dielectric layer 105 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetraethyl orthosilicate, fluoride silicate glass, carbon-doped silicon oxide, or a combination thereof. The first inter-dielectric layer 105 may be formed by, for example, chemical vapor deposition, plasma-enhanced chemical vapor deposition, the like, or other applicable deposition process.

Figure 16:
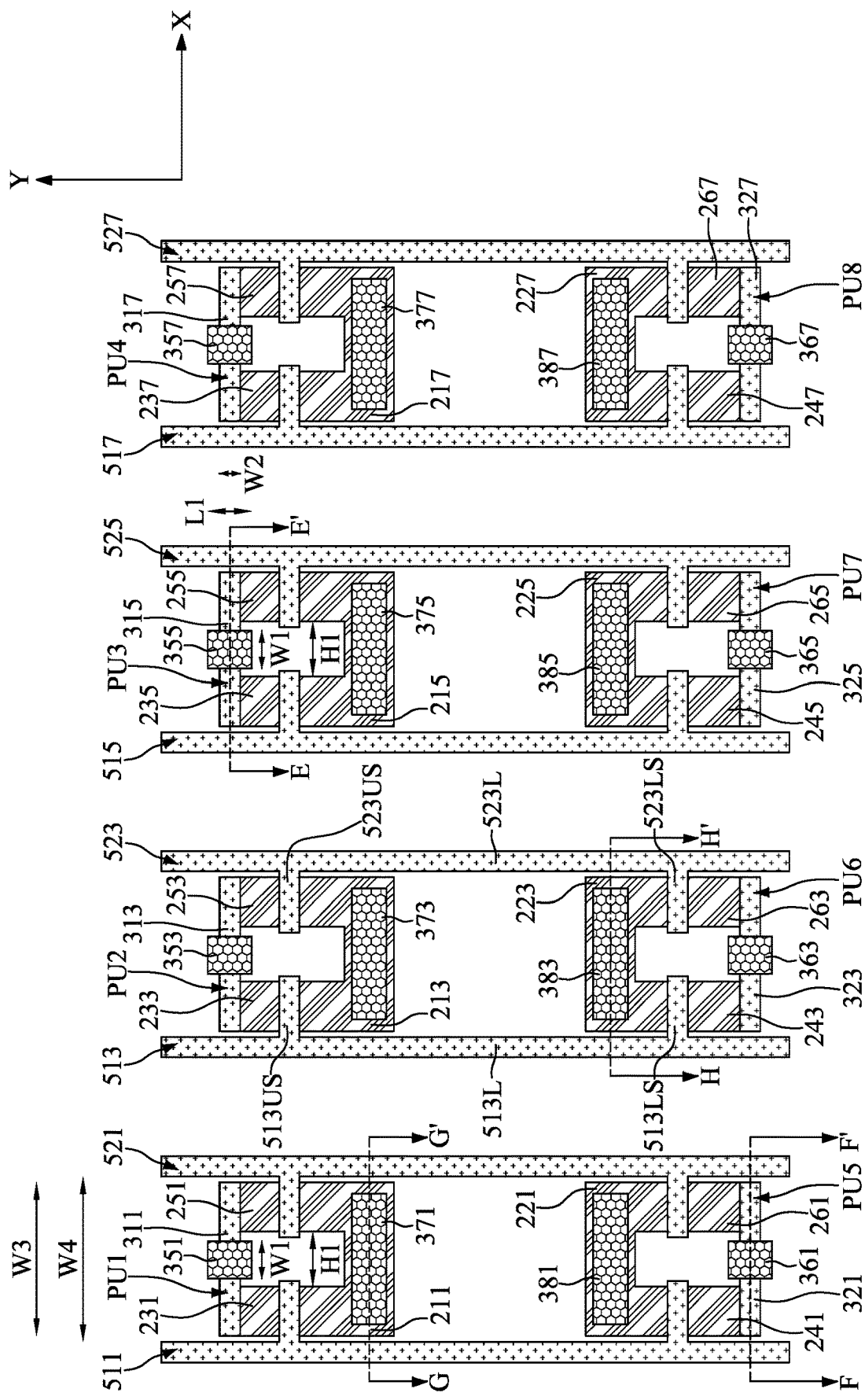
FIG. 16 illustrates, in a schematic top-view diagram, an intermediate semiconductor device in accordance with one embodiment of the present disclosure.
Figure 17:
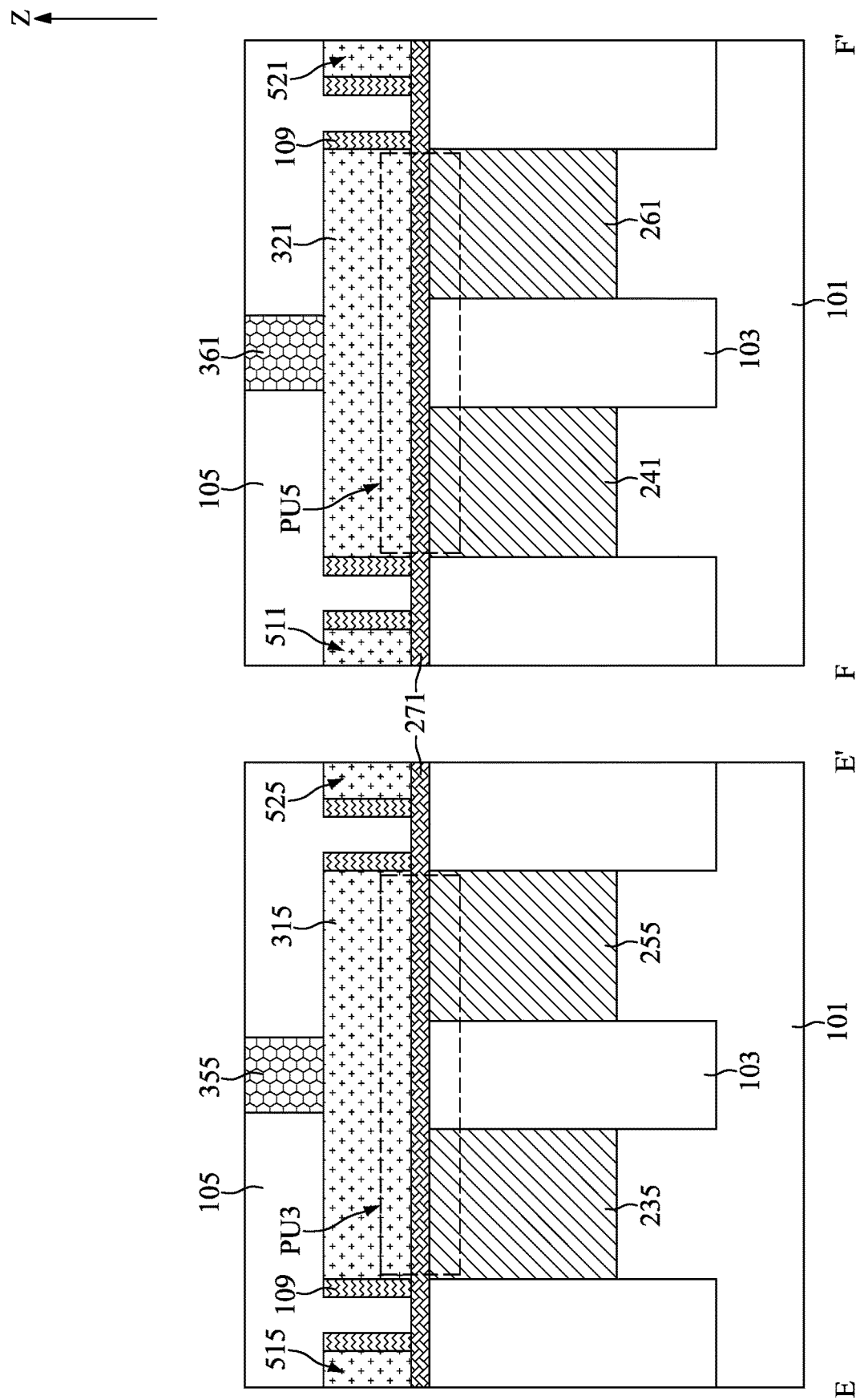
FIGS. 17 and 18 illustrate, in schematic cross-sectional view diagram, intermediate semiconductor devices in accordance with one embodiment of the present disclosure.
Figure 18:
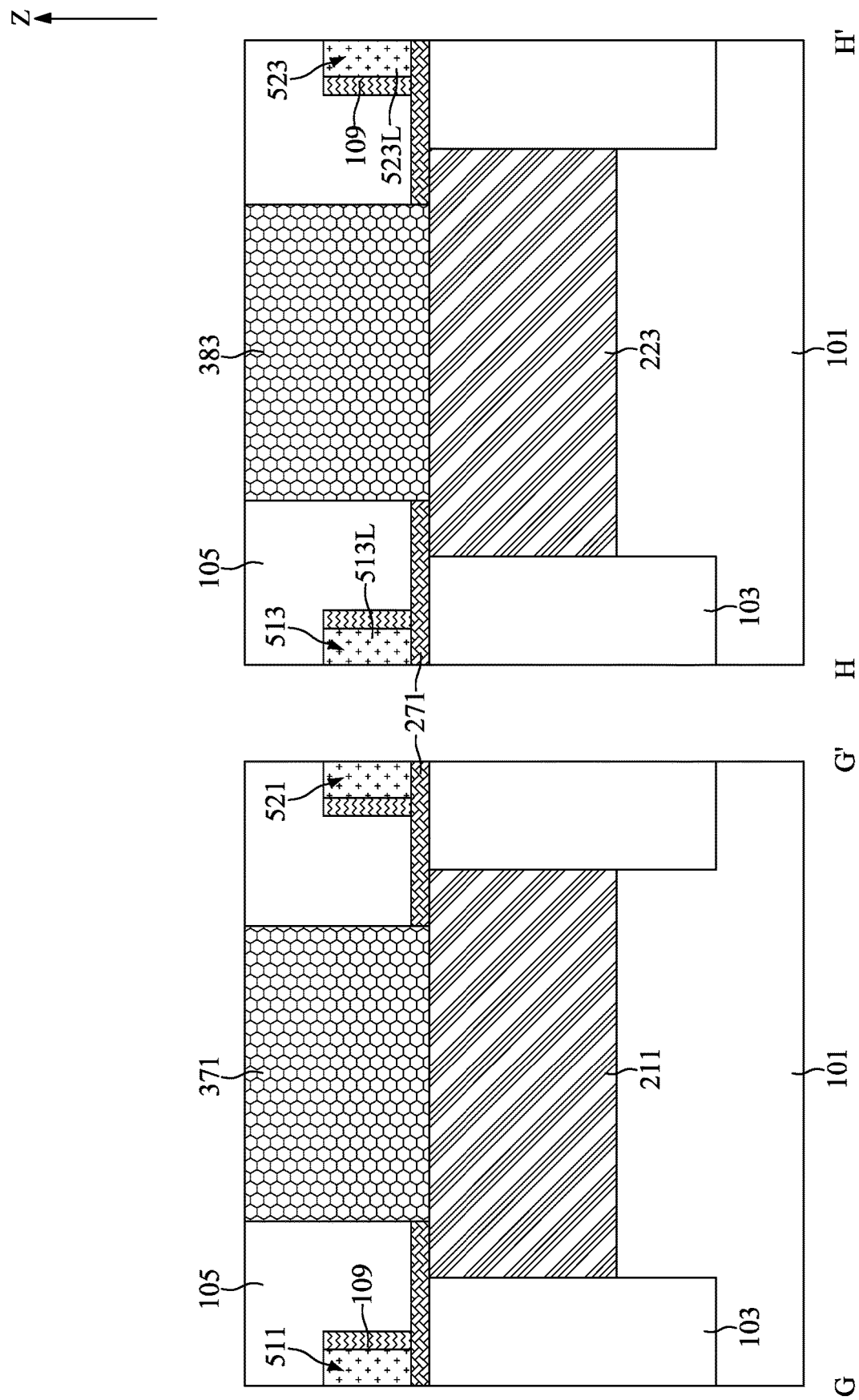

FIG. 16 illustrates, in a schematic top-view diagram, an intermediate semiconductor device in accordance with one embodiment of the present disclosure. FIGS. 17 and 18 are schematic cross-sectional view diagrams taken along the line E-E' and the line F-F' and along the line G-G' and the line H-H' in FIG. 16 illustrating part of the flow for fabricating the semiconductor device in accordance with one embodiment of the present disclosure.

With reference to FIG. 1 and FIGS. 16 to 18, at step S15, a plurality of top contacts 351, 353, 355, 357, 361, 363, 365, 367 may be formed on the plurality of top electrodes 311, 313, 315, 317, 321, 323, 325, 327, and a plurality of source contacts 371, 373, 375, 377, 381, 383, 385, 387 may be formed on the plurality of common source regions 211, 213, 215, 217, 221, 223, 225, 227.

For brevity, clarity, and convenience of description, only one top contact and one source contact are described.

With reference to FIGS. 16 to 18, the top contact 355 may be formed along the first inter-dielectric layer 105 and on the top electrode 315. In some embodiments, the top contact 355 may be topographically above the first branch drain region 235 or the second branch drain region 255. In some embodiments, the top contact 355 may not be topographically above the first branch drain region 235 and the second branch drain region 255. In some embodiments, the width W1 of the top contact 355 may be less than or equal to the horizontal distance H1 between the first branch drain region 235 and the second branch drain region 255. In some embodiments, the width W1 of the top contact 355 may be greater than the horizontal distance H1 between the first branch drain region 235 and the second branch drain region 255. In some embodiments, the length L1 of the top contact 355 may be greater than or equal to the width W2 of the top electrode 315.

With reference to FIGS. 16 to 18, the source contact 371 may be formed along the first inter-dielectric layer 105 and the first dielectric layer 271 and on the common source region 211. In some embodiments, the width W3 of the source contact 371 may be greater than or equal to the width W1 of the top contact 351. In some embodiments, the width W3 of the source contact 371 may be greater than or equal to the horizontal distance H1 between the first branch drain region 231 and the second branch drain region 251. In some embodiments, the width W3 of the source contact 371 may be less than or equal to the width W4 of the top electrode 311.

In some embodiments, the top contact 355 and the source contact 371 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the top contact 355 and the source contact 371 may be concurrently formed. In some embodiments, the top contact 355 and the source contact 371 may be separately formed.

Figure 19:
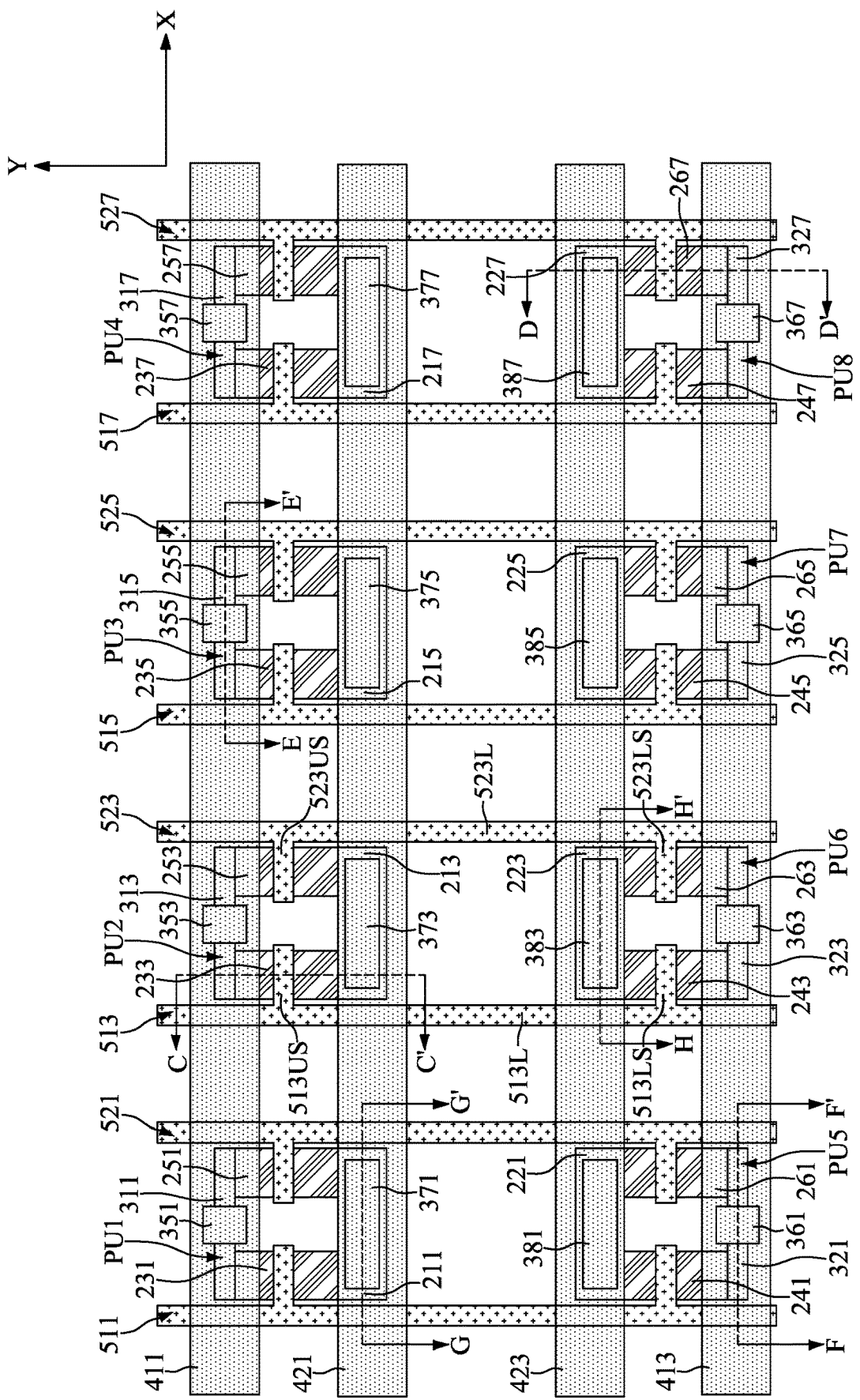
FIG. 19 illustrates, in a schematic top-view diagram, an intermediate semiconductor device in accordance with one embodiment of the present disclosure.
Figure 20:
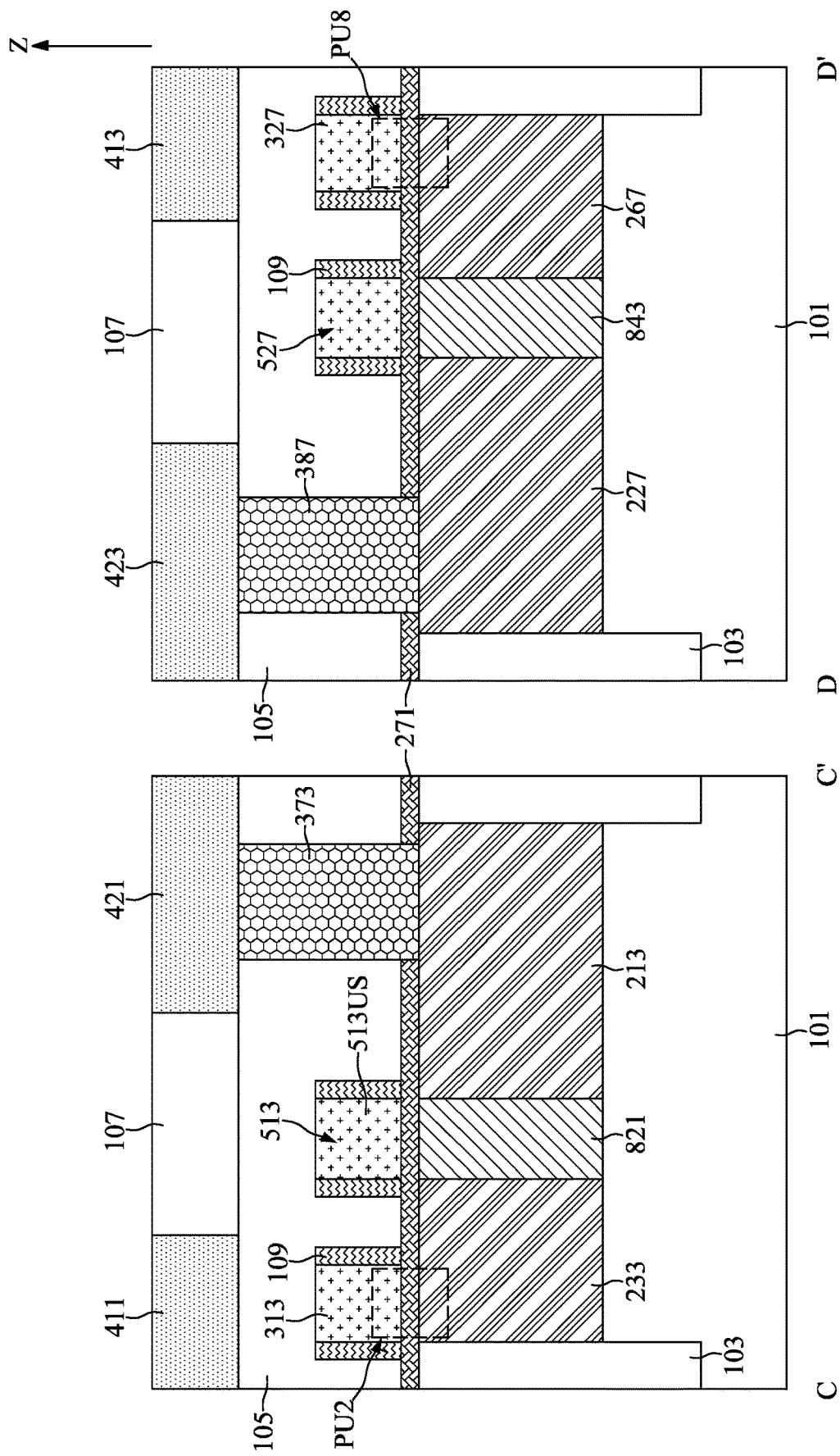
FIGS. 20 to 22 illustrate, in schematic cross-sectional view diagram, intermediate semiconductor devices in accordance with one embodiment of the present disclosure.
Figure 21:
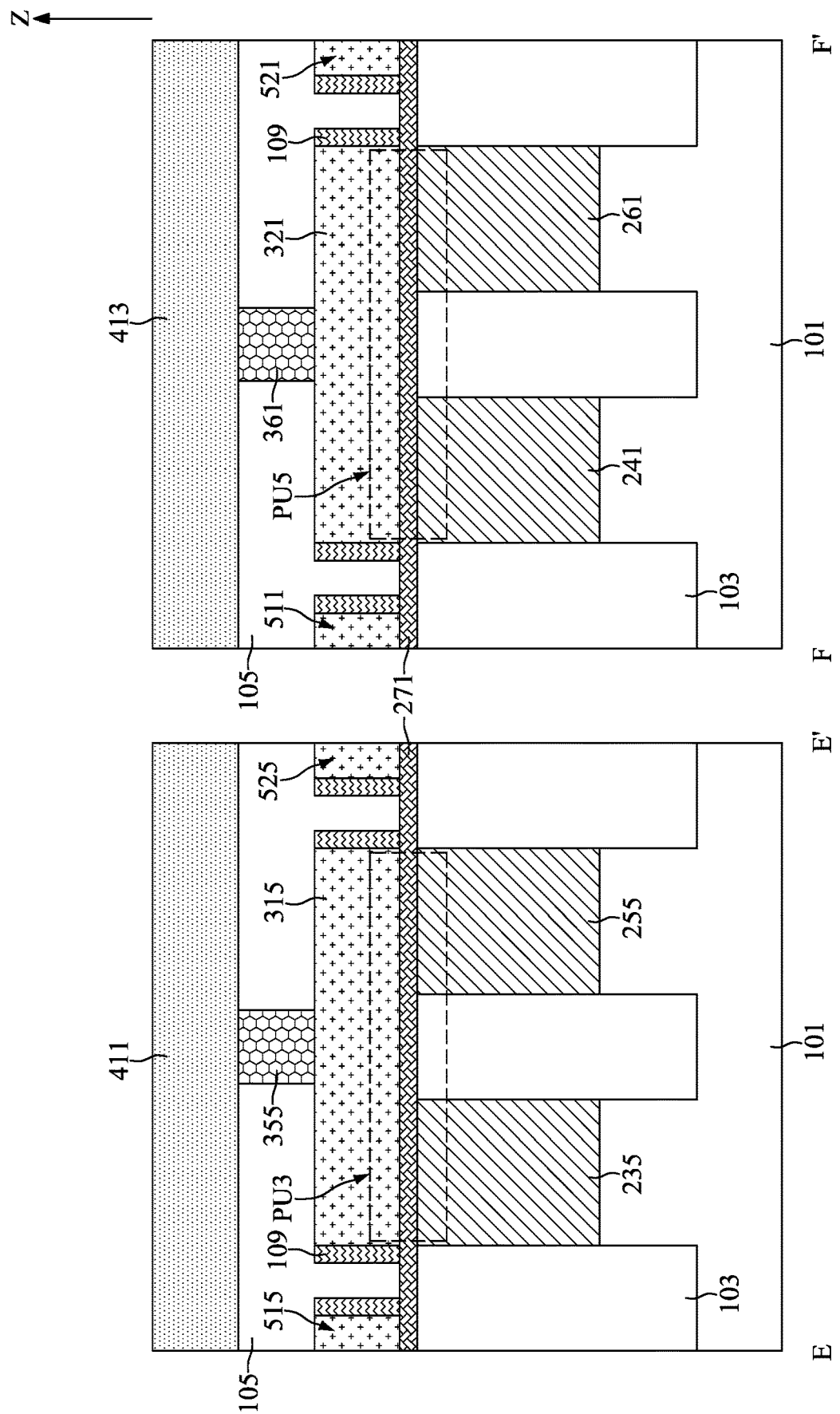
Figure 22:
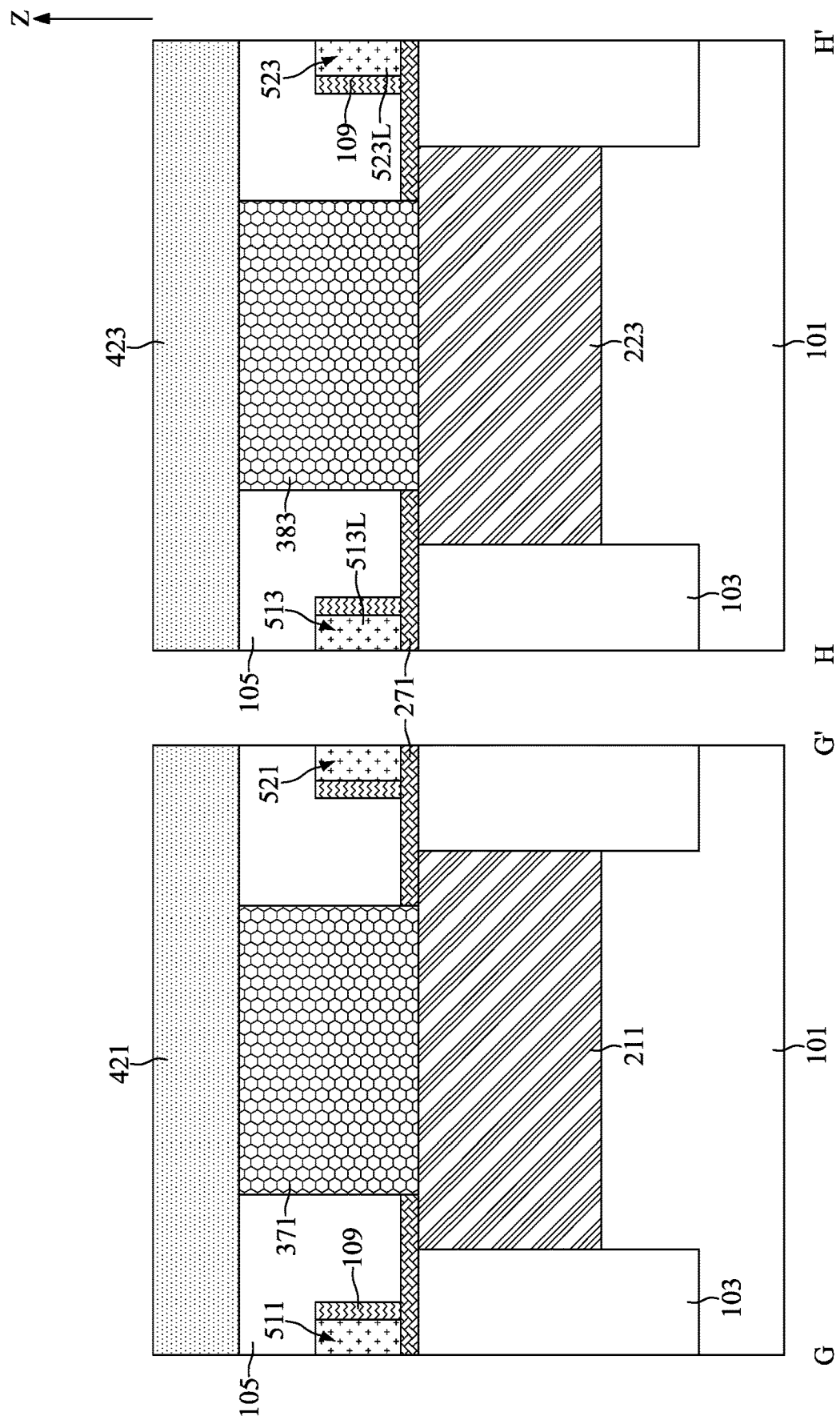

FIG. 19 illustrates, in a schematic top-view diagram, an intermediate semiconductor device in accordance with one embodiment of the present disclosure. FIGS. 20 to 22 are schematic cross-sectional view diagrams taken along the line C-C' and the line D-D', along the line E-E' and the line F-F', and along the line G-G' and the line H-H' in FIG. 19 illustrating part of the flow for fabricating the semiconductor device in accordance with one embodiment of the present disclosure.

With reference to FIG. 1 and FIGS. 19 to 22, at step S17, a plurality of top conductive layers 411, 413 may be formed on the plurality of top contacts 351, 353, 355, 357, 361, 363, 365, 367, and a plurality of bit lines 421, 423 may be formed on the plurality of source contacts 371, 373, 375, 377, 381, 383, 385, 387.

With reference to FIGS. 19 to 22, a second inter-dielectric layer 107 may be formed on the first inter-dielectric layer 105. The second inter-dielectric layer 107 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetraethyl orthosilicate, fluoride silicate glass, carbon-doped silicon oxide, or a combination thereof. The second inter-dielectric layer 107 may be formed by, for example, chemical vapor deposition, plasma-enhanced chemical vapor deposition, the like, or other applicable deposition process. The plurality of common top conductive layers 411, 413 and the plurality of bit lines 421, 423 may be formed in the second inter-dielectric layer 107. The plurality of common top conductive layers 411, 413 and the plurality of bit lines 421, 423 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 19 to 22, the top conductive layer 411 may extend along the direction X and simultaneously formed on the plurality of top contacts 351, 353, 355, 357. The top conductive layer 413 may be parallel to the top conductive layer 411 and simultaneously formed on the plurality of top contacts 361, 363, 365, 367. The bit line 421 may extend along the direction X and simultaneously formed on the plurality of source contacts 371, 373, 375, 377. The bit line 423 may be parallel to the bit line 421 and simultaneously formed on the plurality of source contacts 381, 383, 385, 387.

The top conductive layer 411 may be electrically coupled to an external voltage source to simultaneously provide a programming voltage to the upper row of programming units. The top conductive layer 413 may be electrically coupled to another external voltage source to simultaneously provide a programming voltage to the lower row of programming units. In some embodiments, the same external voltage source may electrically couple to the plurality of top conductive layers 411, 413 to simultaneously provide a programming voltage to the upper row of programming units and the lower row of programming units. The programming voltage may be between about +5.0 volts to +8.0 volts.

The plurality of bit lines 421, 423 may be respectively set between ground potential and −2.0 volts. The plurality of first word line structures 511, 513, 515, 517 and the plurality of second word line structures 521, 523, 525, 527 may be coupled to different voltage sources to control the access and value of the programming current to the programmable units PU1, PU2, PU3, PU4, PU5, PU6, PU7, PU8, respectively and correspondingly electrically.

For example, when the top conductive layer 411 is set to +6.0 volts, the bit line 421 is grounded, and both the first word line structure 513 and the second word line structure 523 are set to +0.0 volts, no current path can produce under the first upper short axis portion 513US or the second upper short axis portion 523US. Therefore, no programming current is produced, and no programming current can access to the first programmable unit. That is, the first dielectric layer 271 of the first programmable unit PU2 remains intact. As a result, the resistance state of the first programmable unit PU2 in such situation is high.

For another example, when the top conductive layer 411 is set to +6.0 volts, the bit line 421 is grounded, and only one of the first word line structure 513 or the second word line structure 523 is set to +0.0 volts while the other one is set to +1.5 volts, current path is only formed under the word line structure which is not set to +0.0 volts.

That is, the programming current can only access to the first programmable unit through one of the word line structures 513, 523. Use the first word line structure 513 as an illustrative example, when only the first word line structure 513 is set to +1.5 volts and the second word line structure 523 is set to +0.0 volts, the programming current (also referred to as the first programming current) can flow through the channel region (or current path) produced under the first upper short axis portion 513US. The first dielectric layer 271 sandwiched by the top electrode 313 and the first branch drain region 233 may be stressed under the programming voltage. As a result, the sandwiched portion of the first dielectric layer 271 will be ruptured to form a contiguous path connecting the top electrode 313 and the first branch drain region 233. In other words, the sandwiched portion of the first dielectric layer 271 may be blown out. The resistance state of the first programmable unit PU2 in such situation is medium.

For yet another example, when the top conductive layer 411 is set to +6.0 volts, the bit line 421 is grounded, and both the first word line structure 513 and the second word line structure 523 are set to +1.5 volts, the programming current (also referred to as the second programming current) can flow through both the channel regions produced under the first upper short axis portion 513US and the second upper short axis portion 523US. The first dielectric layer 271 sandwiched by the top electrode 313 and the first branch drain region 233 and sandwiched by the top electrode 313 and the second branch drain region 253 may be stressed under the programming voltage. As a result, the sandwiched portion of the first dielectric layer 271 may be blown out. Due to the second programming current is greater than the first programming current, the resistance state of the first programmable unit PU2 in such situation is low.

In summary, the resistance state of a programmable unit may be adjusted by controlling voltages applied to the word line structures integrated with the programmable unit. By applying voltages to more word line structures, the programming current may be increased so as to obtain the programmable unit with lower resistance.

Furthermore, by employing the top conductive layers 411, 413, which are simultaneously coupled to multiple programmable units PU1, PU2, PU3, PU4, PU5, PU6, PU7, PU8, and the bit lines 421, 423, it is possible to individually control the programming states (blown out or not) and the resistance state for the programmable units PU1, PU2, PU3, PU4, PU5, PU6, PU7, PU8.

For example, to blow out the programmable units PU2, PU6, the top conductive layers 411, 413 may set to +6.0 volts, the bit lines 421, 423 may be grounded, the first word line structure 513 and/or the second word line structure 523 may be set to +1.5 volts, and the first word line structures 511, 515, 517 and the second word line structures 521, 525, 527 may be set to +0.0 volts.

For another example, to only blow out the programmable unit PU2 the top conductive layers 411, 413 may set to +6.0 volts (also referred to as the first voltage), the bit line 421 may be grounded, the bit line 423 may be set to a voltage between ground potential and the first voltage (e.g., +2.0 volts), the first word line structure 513 and/or the second word line structure 523 may be set to +1.5 volts, and the first word line structures 511, 515, 517 and the second word line structures 521, 525, 527 may be set to +0.0 volts. Due to the higher voltage set to the plurality of bit lines 421, 423, the voltage difference between the bit line 423 and the top conductive layer 413 may not enough to blow out the first dielectric layer 271. Therefore, the lower row of programmable units PU5, PU6, PU7, PU8 may be intact even the top conductive layer 413 is electrically coupled with a high voltage source.

Figure 23:
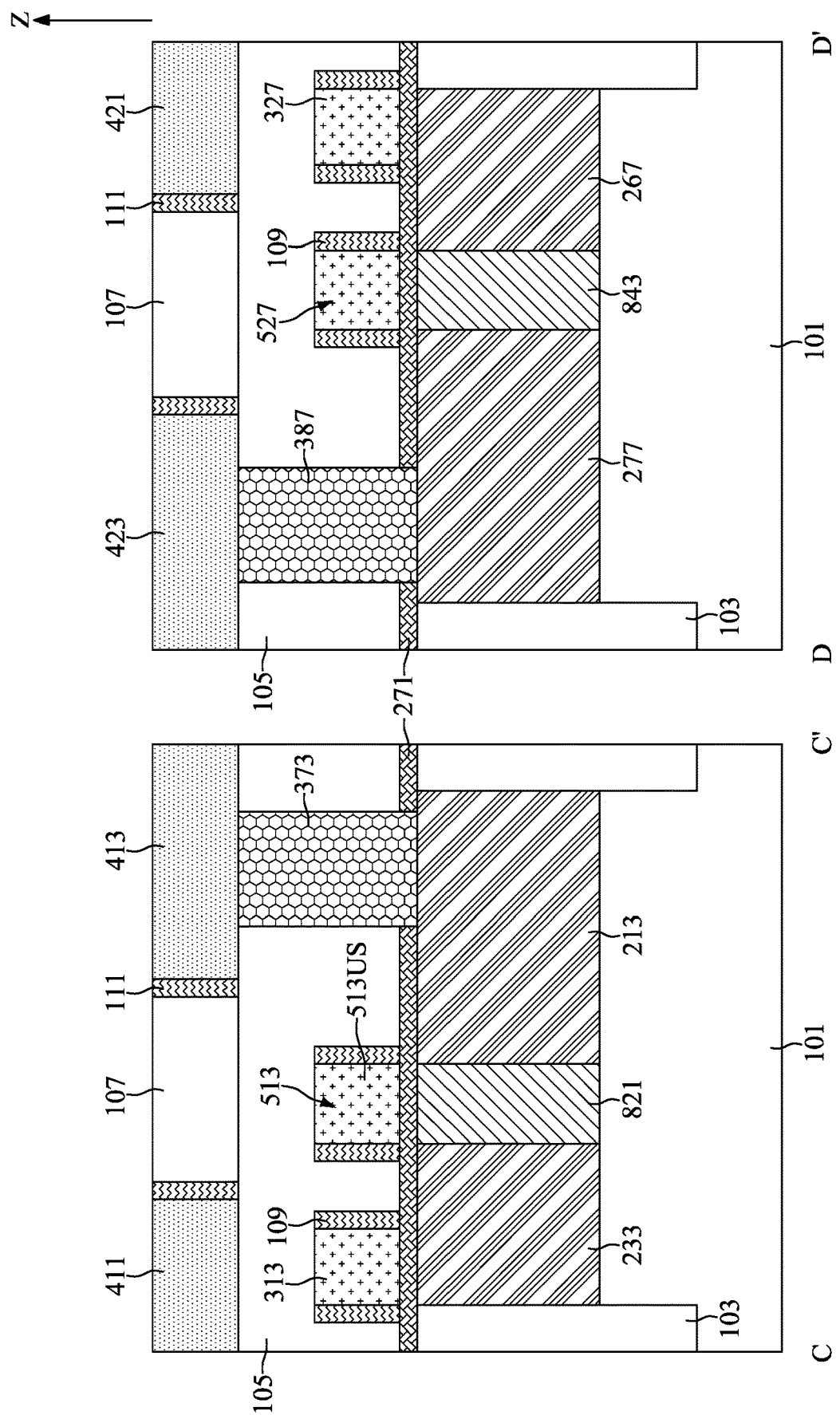
FIG. 23 illustrates, in a schematic cross-sectional view diagram, an intermediate semiconductor device in accordance with another embodiment of the present disclosure.

FIG. 23 illustrate, in a schematic cross-sectional view diagram, an intermediate semiconductor device in accordance with another embodiment of the present disclosure.

With reference to FIG. 23, the intermediate semiconductor device may have a structure similar to that illustrated in FIG. 20. The same or similar elements in FIG. 23 as in FIG. 20 have been marked with similar reference numbers and duplicative descriptions have been omitted. A plurality of second spacers 111 may be disposed on the sidewalls of the top conductive layers 411, 413 and the sidewalls of the plurality of bit lines 421, 423. The plurality of second spacers 111 may be formed of, for example, silicon oxide, silicon nitride, silicon oxynitride, silicon nitride oxide, the like, or other applicable insulation material. The plurality of second spacers 111 may provide additional electrical insulation between adjacent top conductive layer and bit line. In some embodiments, the plurality of second spacers 111 may be formed of, for example, low-k dielectric material so as to reduce parasitic capacitance between adjacent top conductive layer and bit line.

One aspect of the present disclosure provides a semiconductor device including a first dielectric layer positioned on a substrate; a first upper short axis portion and a second upper short axis portion extending along a first direction, separated from each other, and positioned on the first dielectric layer; a first common source region positioned in the substrate and adjacent to the first upper short axis portion and the second upper short axis portion; a first branch drain region positioned in the substrate, adjacent to the first upper short axis portion, and opposite to the first common source region; a second branch drain region positioned in the substrate, adjacent to the second upper short axis portion, and opposite to the first common source region; and a top electrode positioned on the first dielectric layer and topographically above the first branch drain region and the second branch drain region. The top electrode, the first dielectric layer, the first branch drain region, and the second branch drain region together configure a first programmable unit.

Another aspect of the present disclosure provides a method for fabricating a semiconductor device including forming a common source region, a first branch drain region, and a second branch drain region in a substrate, wherein the first branch drain region and the second branch drain region are parallel to each other and both are separated from the common source region; forming a first dielectric layer on the substrate; forming a first upper short axis portion and a second upper short axis portion on the first dielectric layer, wherein the first upper short axis portion and the second upper short axis portion are extending along a first direction and separated from each other, wherein the first upper short axis portion is between the common source region and the first branch drain region, and the second upper short axis portion is between the common source region and the second branch drain region; and forming a top electrode on the first dielectric layer and topographically above the first branch drain region and the second branch drain region. The first branch drain region, the second branch drain region, the first dielectric layer, and the top electrode together configure a programmable unit.

Due to the design of the semiconductor device of the present disclosure, the resistance of the programmable unit may be adjusted by controlling the number of activated (i.e., voltage applied) word line structures. In addition, by employing the top conductive layers 411, 413, which are simultaneously coupled to multiple programmable units, and the bit lines 421, 423, it is possible to individually control the programming states (blown out or not) and the resistance state for the programmable units.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, an x-y-z coordinate system is assumed where x and y refer to dimensions within the plane parallel to the major surface of the structure and z refers a dimension perpendicular to the plane, two features are topographically aligned or a feature is topographically above another feature when those features have substantially the same x, y coordinates.

It should be noted that, in the description of the present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It should be noted that, in the description of the present disclosure, some elements (e.g., substrate and first dielectric layer) in the schematic top-view diagrams may be omitted for clarity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first dielectric layer positioned on a substrate;
    a first upper short axis portion and a second upper short axis portion extending along a first direction, separated from each other, and positioned on the first dielectric layer;
    a first common source region positioned in the substrate and adjacent to the first upper short axis portion and the second upper short axis portion;
    a first branch drain region positioned in the substrate, adjacent to the first upper short axis portion, and opposite to the first common source region;
    a second branch drain region positioned in the substrate, adjacent to the second upper short axis portion, and opposite to the first common source region; and
    a top electrode positioned on the first dielectric layer and topographically above the first branch drain region and the second branch drain region;
    wherein the top electrode, the first dielectric layer, the first branch drain region, and the second branch drain region together configure a first programmable unit.

2. The semiconductor device of claim 1, further comprising a first long axis portion and a second long axis portion;
    wherein the first long axis portion is positioned on the first dielectric layer, extending along a second direction perpendicular to the first direction, and connecting to one end of the first upper short axis portion, and the one end of the first upper short axis portion is opposite to the second upper short axis portion;
    wherein the second long axis portion is positioned on the first dielectric layer, extending along the second direction, and connecting to one end of the second upper short axis portion, and the one end of the second upper short axis portion is opposite to the first upper short axis portion.

3. The semiconductor device of claim 2, further comprising a first lower short axis portion, a second lower short axis portion, a second common source region, and a second programmable unit;
    wherein the first lower short axis portion is positioned on the first dielectric layer, parallel to the first upper short axis portion, and connecting to the first long axis portion;
    wherein the second lower short axis portion is positioned on the first dielectric layer, parallel to the second upper short axis portion, connecting to the second long axis portion, and opposite to the first lower short axis portion;
    wherein the second common source region is positioned in the substrate, separated from the first common source region, and adjacent to the first lower short axis portion and the second lower short axis portion;
    wherein the second programmable unit is positioned separated from the first programmable unit along the second direction and comprises:
        a first branch drain region positioned in the substrate, adjacent to the first lower short axis portion, and opposite to the second common source region;

a second branch drain region positioned in the substrate, adjacent to the second lower short axis portion, and opposite to the second common source region; and a top electrode positioned on the first dielectric layer and topographically above the first branch drain region and the second branch drain region.

4. The semiconductor device of claim 2, further comprising a third upper short axis portion, a fourth upper short axis portion, a second common source region, and a second programmable unit;

wherein the third upper short axis portion is positioned on the first dielectric layer, opposite to the second upper short axis portion with the second long axis portion interposed therebetween, and extending along the first direction;

wherein the fourth upper short axis portion is positioned on the first dielectric layer, separated from the third upper short axis portion, opposite to the second long axis portion, and extending along the first direction;

wherein the second common source region is positioned in the substrate and adjacent to the third upper short axis portion and the fourth upper short axis portion;

wherein the second programmable unit is positioned separated from the first programmable unit along the first direction and comprises:
a first branch drain region positioned in the substrate, adjacent to the third upper short axis portion, and opposite to the second common source region;
a second branch drain region positioned in the substrate, adjacent to the fourth upper short axis portion, and opposite to the second common source region; and
a top electrode positioned on the first dielectric layer and topographically above the first branch drain region and the second branch drain region.

5. The semiconductor device of claim 4, further comprising a first top contact, a second top contact, and a top conductive layer;

wherein the first top contact is positioned on the top electrode of the first programmable unit;

wherein the second top contact is positioned on the top electrode of the second programmable unit;

wherein the top conductive layer is extending along the first direction and positioned on the first top contact and the second top contact.

6. The semiconductor device of claim 5, further comprising a first source contact, a second source contact, and a bit line;

wherein the first source contact is positioned on the first common source region;

wherein the second source contact is positioned on the second common source region;

wherein the bit line is extending along the first direction and positioned on the first source contact and the second source contact.

7. The semiconductor device of claim 6, wherein a width of the first source contact is greater than a width of first top contact.

8. The semiconductor device of claim 6, wherein a width of the first source contact is greater than or equal to a distance between the first branch drain region and the second branch drain region of the first programmable unit.

9. The semiconductor device of claim 1, further comprising a top contact positioned on the top electrode of the first programmable unit.

10. The semiconductor device of claim 9, wherein a width of the top contact is less than a horizontal distance between the first branch drain region and the second branch drain region of the first programmable unit.

11. The semiconductor device of claim 9, wherein a length of the top contact is greater than or equal to a width of the top electrode of the first programmable unit.

12. The semiconductor device of claim 9, further comprising a top conductive layer positioned on the top contact and extending along the first direction.

13. The semiconductor device of claim 12, further comprising a plurality of second spacers positioned on sidewalls of the top conductive layer;

wherein the plurality of second spacers comprises silicon oxide, silicon nitride, silicon oxynitride, or silicon nitride oxide.

14. The semiconductor device of claim 1, further comprising a source contact positioned on the first common source region.

15. The semiconductor device of claim 14, further comprising a bit line positioned on the source contact and extending along the first direction.

16. The semiconductor device of claim 14, wherein a width of the top electrode is greater than or equal to a width of the source contact.

17. A method for fabricating a semiconductor device, comprising:
forming a common source region, a first branch drain region, and a second branch drain region in a substrate;
wherein the first branch drain region and the second branch drain region are parallel to each other and both are separated from the common source region;
forming a first dielectric layer on the substrate;
forming a first upper short axis portion and a second upper short axis portion on the first dielectric layer;
wherein the first upper short axis portion and the second upper short axis portion are extending along a first direction and separated from each other;
wherein the first upper short axis portion is between the common source region and the first branch drain region, and the second upper short axis portion is between the common source region and the second branch drain region; and
forming a top electrode on the first dielectric layer and topographically above the first branch drain region and the second branch drain region;
wherein the first branch drain region, the second branch drain region, the first dielectric layer, and the top electrode together configure a programmable unit.

18. The method for fabricating the semiconductor device of claim 17, further comprising:
forming a top contact on the top electrode;
forming a source contact along the first dielectric layer and on the common source region;
forming a top conductive layer on the top contact and extending along the first direction; and
forming a bit line on the source contact and extending along the first direction.

19. The method for fabricating the semiconductor device of claim 18, wherein the top electrode and the first upper short axis portion are concurrently formed.

20. The method for fabricating the semiconductor device of claim 19, wherein the top contact and the source contact are concurrently formed.

* * * * *